(12) United States Patent
Frougier et al.

(10) Patent No.: US 10,833,191 B2
(45) Date of Patent: Nov. 10, 2020

(54) INTEGRATING NANOSHEET TRANSISTORS, ON-CHIP EMBEDDED MEMORY, AND EXTENDED-GATE TRANSISTORS ON THE SAME SUBSTRATE

(71) Applicant: International Business Machines Corporation, Armonk, NY (US)

(72) Inventors: Julien Frougier, Albany, NY (US); Ruilong Xie, Niskayuna, NY (US); Kangguo Cheng, Schenectady, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 79 days.

(21) Appl. No.: 16/292,915

(22) Filed: Mar. 5, 2019

(65) Prior Publication Data

US 2020/0287046 A1 Sep. 10, 2020

(51) Int. Cl.
*H01L 21/8238* (2006.01)
*H01L 21/336* (2006.01)
(Continued)

(52) U.S. Cl.
CPC .. *H01L 29/7841* (2013.01); *H01L 21/823412* (2013.01); *H01L 27/10826* (2013.01); *H01L 27/10879* (2013.01); *H01L 27/115* (2013.01); *H01L 27/11536* (2013.01); *H01L 27/1211* (2013.01); *H01L 29/66439* (2013.01);
(Continued)

(58) Field of Classification Search
CPC ......... H01L 27/10826; H01L 27/10879; H01L 27/1211; H01L 27/11536; H01L 29/7841; H01L 21/823412; H01L 27/115; H01L 29/66439; H01L 29/775; H01L 29/7831; H01L 29/785; H01L 29/29; H01L 29/78696
See application file for complete search history.

(56) References Cited

U.S. PATENT DOCUMENTS 8,778,768 B1 7/2014 Chang et al.
9,287,357 B2 3/2016 Rodder et al.
(Continued)

OTHER PUBLICATIONS

Weckx et al., "Stacked nanosheet fork architecture for SRAM design and device co-optimization toward 3nm," 2017 IEEE International Electron Devices Meeting, 2017, 4 pages.

*Primary Examiner* — Alonzo Chambliss
(74) *Attorney, Agent, or Firm* — Cantor Colburn LLP; Joseph Petrokaitis

(57) ABSTRACT

Embodiments of the invention are directed to methods of fabricating devices on a substrate. A non-limiting example of the method includes performing memory fabrication operations to form a non-volatile memory device in a first region of the substrate, wherein the memory fabrication operations include forming a first region of a nanosheet stack over the first region of the substrate. The first region of the nanosheet stack includes nanosheet layers of a first type of semiconductor material alternating with nanosheet layers of a second type of semiconductor material. A first portion of the first region of the nanosheet stack is replaced with a control gate of the non-volatile memory device, and a charge trapping region of the non-volatile memory device is provided under the control gate.

20 Claims, 20 Drawing Sheets

(51) Int. Cl.
  *H01L 29/76*      (2006.01)
  *H01L 29/78*      (2006.01)
  *H01L 27/115*     (2017.01)
  *H01L 29/786*     (2006.01)
  *H01L 29/775*     (2006.01)
  *H01L 29/66*      (2006.01)
  *H01L 21/8234*    (2006.01)
  *H01L 27/11536*   (2017.01)
  *H01L 27/12*      (2006.01)
  *H01L 27/108*     (2006.01)

(52) U.S. Cl.
  CPC .. *H01L 29/66545* (2013.01); *H01L 29/66795* (2013.01); *H01L 29/775* (2013.01); *H01L 29/785* (2013.01); *H01L 29/7831* (2013.01); *H01L 29/78696* (2013.01)

(56) References Cited

U.S. PATENT DOCUMENTS

| | | |
|---|---|---|
| 9,905,672 B2 | 2/2018 | Wang et al. |
| 9,991,112 B2 | 6/2018 | Chung et al. |
| 9,991,352 B1 | 6/2018 | Frougier et al. |
| 10,141,403 B1 * | 11/2018 | Cheng ............... H01L 29/66439 |
| 10,679,890 B2 * | 6/2020 | Reznicek .......... H01L 29/78696 |
| 10,707,304 B2 * | 7/2020 | Reznicek ........ H01L 21/823828 |
| 2009/0045452 A1 * | 2/2009 | Lue .................... G11C 16/0466 257/321 |
| 2017/0256609 A1 | 9/2017 | Bhuwalka et al. |
| 2018/0083212 A1 | 3/2018 | Yoon et al. |
| 2018/0190835 A1 | 7/2018 | Lee et al. |

* cited by examiner

INTEGRATING NANOSHEET TRANSISTORS, ON-CHIP EMBEDDED MEMORY, AND EXTENDED-GATE TRANSISTORS ON THE SAME SUBSTRATE

BACKGROUND

The present invention relates in general to semiconductor devices and their fabrication. More specifically, the present invention relates to co-integrated fabrication processes and resulting structures that provide nanosheet transistors, on-chip embedded memory, and extended-gate transistors on the same substrate.

In contemporary semiconductor device fabrication processes, a large number of semiconductor devices such as n-type field effect transistors (nFETs) and p-type field effect transistors (pFETs) are fabricated on a single wafer. Non-planar transistor architectures such as fin-type FETs (FinFET) and nanosheet (or nanowire) transistors can provide increased device density and increased performance over planar transistors. FinFETs are non-planar, three-dimensional (3D) transistors that include a fin-shaped channel with a gate formed along the sidewalls and top surface of the fin channel. Nanosheet transistors are non-planar, 3D transistors that include a gate stack wrapped around the full perimeter of multiple nanosheet channel regions for improved control of channel current flow. Nanosheet transistor architectures enable fuller depletion in the nanosheet channel regions and reduce short-channel effects. In order to increase the maximum gate voltage of certain transistors, so-called extended gate (EG) transistors have been developed that include a larger volume of gate metal and/or a thicker gate oxide (known as EG oxide) configured to tolerate larger transistor threshold voltages $V_T$. EG transistors can be embodied in a variety of transistor architectures, including, for example, FinFETs and nanosheet transistors.

Embedded flash (eFlash) memory is an enabling technology for programmable semiconductor products that require small form factor component devices and low-power processing. For example, microcontrollers (MCUs) use eFlash memory to store program instructions and the data on which processing is performed. Smart sensor devices (e.g., Internet-of-Things (IoT) sensors) use eFlash memory to enable smart, flexible, and secure products that can be updated wirelessly or over-the-air (OTA). In general, embedding electronic devices with eFlash memory enable a wide-range of products such as smart cards, wearable computing devices, factory automation systems, and autonomous vehicles.

SUMMARY

Embodiments of the invention are directed to methods of fabricating devices on a substrate. A non-limiting example of the method includes performing memory fabrication operations to form a non-volatile memory device in a first region of the substrate, wherein the memory fabrication operations include forming a first region of a nanosheet stack over the first region of the substrate. The first region of the nanosheet stack includes nanosheet layers of a first type of semiconductor material alternating with nanosheet layers of a second type of semiconductor material. A first portion of the first region of the nanosheet stack is replaced with a control gate of the non-volatile memory device, and a charge trapping region of the non-volatile memory device is provided under the control gate.

Embodiments of the invention are directed to methods of fabricating devices on a substrate. A non-limiting example of the method includes performing memory fabrication operations to form a non-volatile memory device in a first region of the substrate. The memory fabrication operations include forming a first region of the nanosheet stack over a first region of the substrate. The first region of nanosheet stack includes alternating layers of sacrificial nanosheets and non-sacrificial nanosheets. At least a portion of the first region of the nanosheet stack is replaced with a control gate, and a charge trapping region of the non-volatile memory device is provided under the control gate. The method further includes performing nanosheet fabrication operations to form a nanosheet field effect transistor (FET) device in a second region of the substrate. The nanosheet fabrication operations include forming a second region of the nanosheet stack over a second region of the substrate. The second region of the nanosheet stack includes the alternating layers of sacrificial nanosheets and non-sacrificial nanosheets. Bottom isolation regions are formed over the second region, and nanosheet source or drain (S/D) regions are formed over the bottom isolation regions and adjacent end regions of the non-sacrificial nanosheets of the second region of the nanosheet stack. The sacrificial nanosheets of the second region of the nanosheet stack are replaced with a first set of conductive gate regions, and a second conductive gate region is formed over and around the second region of the nanosheet stack. The method further includes performing extended-gate (EG) fabrication operations to form an EG FET device in a third region of the substrate. The EG fabrication operations include forming a fin in the third region of the substrate, forming selected ones of the bottom isolation regions over the third region of the substrate and adjacent to a portion of the fin, forming EG S/D regions over the bottom isolation regions and adjacent sidewalls of the fin, and forming selected portions of the second conductive gate region over and around the fin.

Embodiments of the invention are directed to an integrated circuit (IC) structure having a first region of a nanosheet stack formed over a first region of a substrate, wherein the first region of the nanosheet stack includes a nanosheet layer of a first type of semiconductor material and a nanosheet layer of a second type of semiconductor material. A control gate is over the first region of the nanosheet stack of the non-volatile memory device. A charge trapping region of the non-volatile memory device is under the control gate, and the charge trapping region includes the nanosheet layer of the first type of semiconductor material and the nanosheet layer of the second type of semiconductor material. Memory source or drain (S/D) regions are positioned over the first region of the substrate, and a portion of the first region of the substrate is positioned between a first one of the S/D regions and a second one of the S/D regions. The channel region includes the portion of the first region of the substrate that is positioned between the first one of the S/D regions and the second one of the S/D regions. A non-volatile memory device of the IC includes a non-volatile memory transistor, the control gate, and the charge trapping region. The non-volatile memory transistor includes the first one of the S/D regions, the second one of the S/D regions, and the channel region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-13 depict cross-sectional views of a section of a substrate/wafer after various fabrication operations to form nanosheet transistor devices, on-chip embedded memory devices, and EG transistor devices thereon according to embodiments of the invention, in which:

FIG. 1 depicts a cross-sectional view of semiconductor structures after initial fabrication operations for forming nanosheet transistor devices, on-chip embedded memory devices, and EG transistor devices on the same substrate according to embodiments of the invention;

FIG. 2 depicts a cross-sectional view of semiconductor structures after fabrication operations for forming nanosheet transistor devices, on-chip embedded memory devices, and EG transistor devices on the same substrate according to embodiments of the invention;

FIG. 3 depicts a cross-sectional view of semiconductor structures after fabrication operations for forming nanosheet transistor devices, on-chip embedded memory devices, and EG transistor devices on the same substrate according to embodiments of the invention;

FIG. 4 depicts a cross-sectional view of semiconductor structures after fabrication operations for forming nanosheet transistor devices, on-chip embedded memory devices, and EG transistor devices on the same substrate according to embodiments of the invention;

FIG. 5 depicts a cross-sectional view of semiconductor structures after fabrication operations for forming nanosheet transistor devices, on-chip embedded memory devices, and EG transistor devices on the same substrate according to embodiments of the invention;

FIG. 6 depicts a cross-sectional view of semiconductor structures after fabrication operations for forming nanosheet transistor devices, on-chip embedded memory devices, and EG transistor devices on the same substrate according to embodiments of the invention;

FIG. 7 depicts a cross-sectional view of semiconductor structures after fabrication operations for forming nanosheet transistor devices, on-chip embedded memory devices, and EG transistor devices on the same substrate according to embodiments of the invention;

FIG. 8 depicts a cross-sectional view of semiconductor structures after fabrication operations for forming nanosheet transistor devices, on-chip embedded memory device, and EG transistor devices on the same substrate according to embodiments of the invention;

FIG. 9 depicts a cross-sectional view of semiconductor structures after fabrication operations for forming nanosheet transistor devices, on-chip embedded memory devices, and EG transistor devices on the same substrate according to embodiments of the invention;

FIG. 10 depicts a cross-sectional view of semiconductor structures after fabrication operations for forming nanosheet transistor devices, on-chip embedded memory devices, and EG transistor devices on the same substrate according to embodiments of the invention;

FIG. 11 depicts a cross-sectional view of semiconductor structures after fabrication operations for forming nanosheet transistor devices, on-chip embedded memory devices, and EG transistor devices on the same substrate according to embodiments of the invention;

FIG. 12 depicts a cross-sectional view of semiconductor structures after fabrication operations for forming nanosheet transistor devices, on-chip embedded memory devices, and EG transistor devices on the same substrate according to embodiments of the invention; and FIG. 13 depicts a cross-sectional view of semiconductor structures after fabrication operations for forming nanosheet transistor devices, on-chip embedded memory devices, and EG transistor devices on the same substrate according to embodiments of the invention;

FIGS. 14-20 depict cross-sectional views of a section of a substrate/wafer after various fabrication operations to form nanosheet transistor devices, on-chip embedded memory devices, and EG transistor devices thereon according to embodiments of the invention, in which:

FIG. 14 depicts a cross-sectional view of semiconductor structures after initial fabrication operations for forming nanosheet transistor devices, on-chip embedded memory devices, and EG transistor devices on the same substrate according to embodiments of the invention;

FIG. 15 depicts a cross-sectional view of semiconductor structures after fabrication operations for forming nanosheet transistor devices, on-chip embedded memory devices, and EG transistor devices on the same substrate according to embodiments of the invention;

FIG. 16 depicts a cross-sectional view of semiconductor structures after fabrication operations for forming nanosheet transistor devices, on-chip embedded memory devices, and EG transistor devices on the same substrate according to embodiments of the invention;

FIG. 17 depicts a cross-sectional view of semiconductor structures after fabrication operations for forming nanosheet transistor devices, on-chip embedded memory devices, and EG transistor devices on the same substrate according to embodiments of the invention;

FIG. 18 depicts a cross-sectional view of semiconductor structures after fabrication operations for forming nanosheet transistor devices, on-chip embedded memory devices, and EG transistor devices on the same substrate according to embodiments of the invention;

FIG. 19 depicts a cross-sectional view of semiconductor structures after fabrication operations for forming nanosheet transistor devices, on-chip embedded memory devices, and EG transistor devices on the same substrate according to embodiments of the invention; and FIG. 20 depicts a cross-sectional view of semiconductor structures after fabrication operations for forming nanosheet transistor devices, on-chip embedded memory device, and EG transistor devices on the same substrate according to embodiments of the invention.

DETAILED DESCRIPTION

Figure 1:
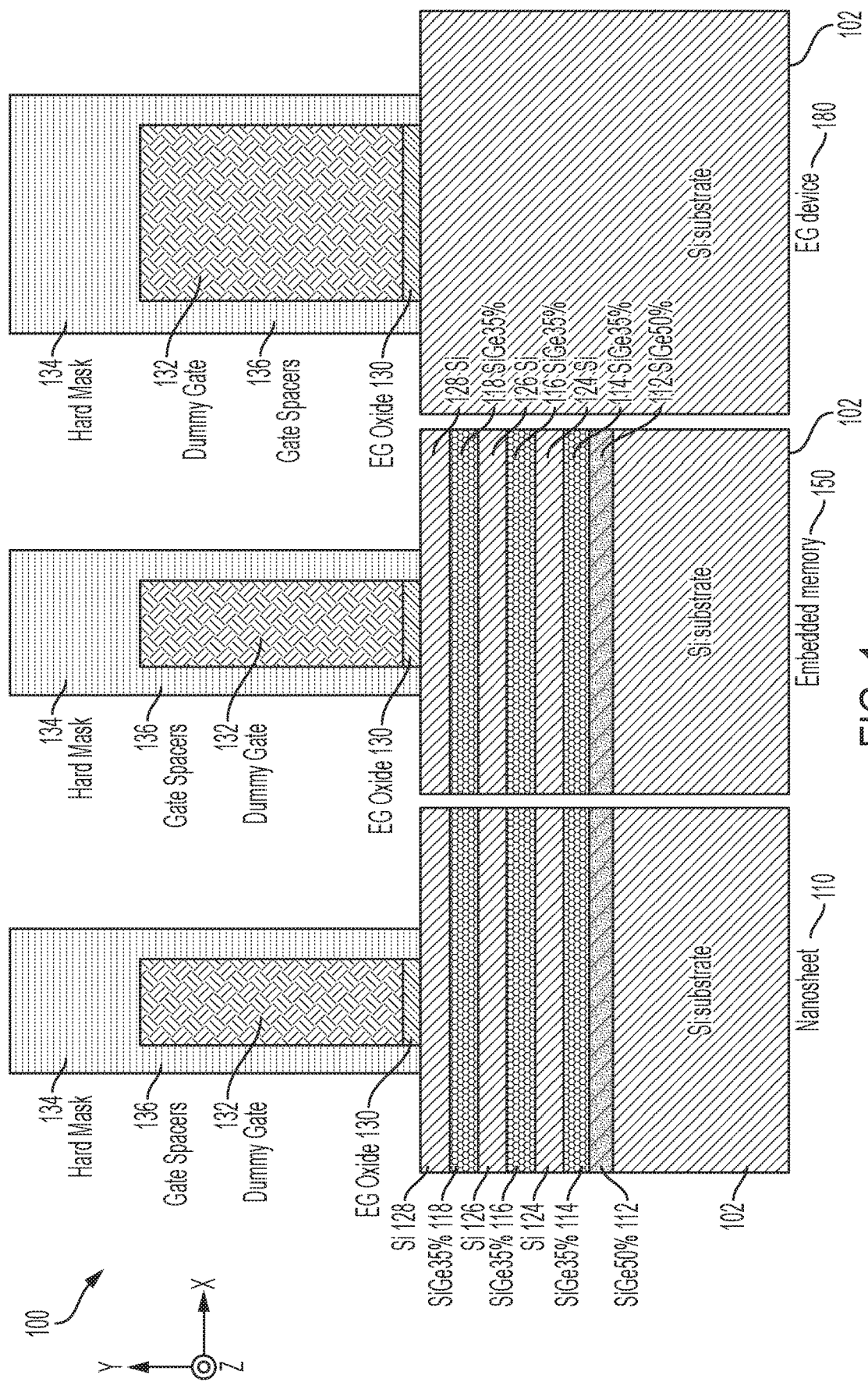

It is understood in advance that although this invention includes a detailed description of exemplary architectures for nanosheet transistors, floating gate flash memory, SONOS (silicon-oxide-nitride-oxide-silicon) floating gate flash memory, and EG transistors, embodiments of the invention are not limited to the particular transistor architectures, flash memory architectures, or materials described in this specification. Rather, the novel fabrication techniques and resulting structures of embodiments of the invention are capable of being implemented in conjunction with any other type of transistor architecture, flash memory architecture, or material now known or later developed. Additionally, in this detailed description and the claims, the terms nanosheet and nanowire are treated as synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The channel region connects the source and the drain, and electrical current flows through the channel region from the source to the drain. The electrical current flow is induced in the channel region by a voltage applied at the gate electrode. Complementary metal oxide semiconductor (CMOS) is a technology that uses complementary and symmetrical pairs of p-type and n-type MOSFETs to implement logic functions.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size/footprint is to use a FinFET device architecture. The basic electrical layout and mode of operation of a FinFET does not differ significantly from a traditional FET. FinFETs are non-planar, three-dimensional (3D) transistors that include a fin-shaped body with a gate formed along the sidewalls and top surface of a central region of the fin. The fin defines a source region at one end of the fin, a drain region at an opposite end of the fin, and a channel region in the central region of the fin that is under the gate. A bias on the gate makes the central region of the fin conductive and allows current to flow from the source through the channel to the drain. Channel conductivity is improved over planar MOSFETs because the height and width dimensions of the fin establish the effective channel width ($W_{eff}$) of the FinFET.

Another known method of increasing channel conductivity and decreasing FET size/footprint is to form the channel as a nanostructure. For example, a so-called gate-all-around (GAA) nanosheet FET is a known architecture for providing a relatively small FET footprint by forming the channel region as a series of vertically stacked and spaced apart nanosheets. In a known GAA configuration, a nanosheet-based FET includes a source region, a drain region and vertically stacked, spaced apart nanosheet channels between the source and drain regions. A gate surrounds the vertically stacked, spaced apart nanosheet channels and regulates electron flow through the nanosheet channels between the source and drain regions. The vertically stacked, spaced apart nanosheet channels of a GAA nanosheet FETs can be fabricated by forming alternating layers of channel nanosheets and sacrificial nanosheets. The sacrificial nanosheets are released from the channel nanosheets before the FET device is finalized, and a metal gate is formed in the spaces that were occupied by the sacrificial nanosheets.

For n-type FETs, the channel nanosheets are typically silicon (Si) and the sacrificial nanosheets are typically silicon germanium (SiGe). For p-type FETs, the channel nanosheets are typically SiGe and the sacrificial nanosheets are typically Si. In some implementations, the channel nanosheet of a p-type FET can be SiGe or Si, and the sacrificial nanosheet can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Some IC applications require the use of so-called standard-gate (SG) transistors configured to tolerate a maximum gate/threshold voltage ($V_T$) at a predetermined SG level. For other IC applications (e.g., input/output (I/O) circuitry), transistors need to tolerate a $V_T$ that is higher than SG $V_T$ levels. In order to increase the maximum $V_T$ of certain transistors, so-called extended gate (EG) transistors have been developed that include a larger volume of gate metal and/or a thicker gate oxide than so-called SG nanosheet transistors. Nonplanar FETs (e.g., FinFETs and nanosheet FETs) can be formed as SG or EG devices.

A microcontrollers (MCUs) is a small computer on a single IC that typically contains a central processing unit (CPU) core, static random access memory (SRAM) modules, embedded flash memory modules, a system integration module and peripheral modules including a timer, an analog-to-digital converter (ADC), serial communication and networking. In contrast to microprocessors, which are used in personal computers and other high-performance applications, MCUs are designed for small applications such as automotive electronics, consumer electronics, computers, computer peripherals, wired/wireless communications, smart cards and other simple applications using repeatable programs.

Embedded flash memory technologies deviate significantly from dominant discrete flash memory technologies due to their specific requirements such as host-logic CMOS process compatibility, performance, cost, and reliability. Accordingly, it would be beneficial to provide efficient fabrication methods and resulting ICs that take advantage of the performance benefits that result from using non-planar transistor architectures (e.g., FinFETs, nanosheet FETs, SG transistors, EG transistors, and the like) while also providing on-chip embedded flash memory.

Turning now to an overview of aspects of the invention, embodiments of the invention provide fabrication operations and resulting structures for co-integrating nanosheet/ nanowire FETs, on-chip embedded flash memory, and/or EG transistors on the same substrate. In embodiments of the invention, a nanosheet transistor fabrication process is used as the baseline fabrication process, and the nanosheet/nanowire FETs, the on-chip embedded flash memory, and/or the EG transistors are designed to selectively share certain nanosheet-based fabrication operations for certain features, and also selectively modify certain nanosheet-based fabrication operations for certain features. For example, in some embodiments of the invention, the processes to form the bottommost channel nanosheets and the charge trapping regions of the on-chip embedded flash memory are substantially the same. In some embodiments of the invention where the embedded memory is a SONOS floating gate configuration, a unique selective etch process is used to selectively convert the bottommost channel nanosheets to the charge trapping nitride of the SONOS floating gate. In embodiments of the invention, the unique selective etch process leverages the etch selectivity that can be established between SiGe regions having a first Ge percentage (e.g., about 35% Ge) and SiGe regions having a second Ge percentage (e.g., about 50% Ge).

Turning now to a more detailed description of aspects of the invention, FIGS. 1-13 depict cross-sectional views of a section of an IC wafer 100 after various fabrication operations have been applied to form nanosheet transistor devices (i.e., the logic devices) in a nanosheet region 110 of a substrate 102, on-chip embedded memory devices in an embedded memory region 150 of the substrate 102, and EG (i.e., high $V_T$) transistor devices in an EG device region 180 of the substrate 102 according to embodiments of the invention. For ease of illustration, the fabrication operations depicted in FIGS. 1-13 will be described in the context of forming one nanosheet transistor device in the nanosheet region 110, one on-chip embedded memory device in the embedded memory region 150, and one EG transistor device in the EG device region 180, it is intended that fabrication operations described herein apply equally to the fabrication of multiple nanosheet, on-chip embedded memory, and EG devices in the regions 110, 150, 180, respectively, of the substrate 102.

Although the diagrams depicted in FIGS. 1-13 are two-dimensional, it is understood that the structures depicted in FIGS. 1-13 are three-dimensional. The x/y/z diagram depicted in FIG. 1 is to represent that the various elements depicted in FIGS. 1-13 extend along a first axis (e.g., x-axis) to define width dimensions, extend along a second axis (e.g., y-axis) perpendicular to the x-axis to define height dimensions, and extend along a third axis (e.g., z-axis) perpendicular to the first axis and the second axis to define depth dimensions. In accordance with standard CMOS fabrication operations, various elements of the fabrication stages depicted in FIGS. 1-13 extend completely around other elements in the x-axis, y-axis, and z-axis directions. For example, the gate structures (e.g., EG oxides 130, dummy gates 132, and gate spacers 136) shown in FIG. 1 extend over and around the stack of alternating layers 112, 114, 124, 116, 126, 118, 128 in the nanosheet region 110 and the embedded memory region 150 of the substrate 102, and the gate structures (e.g., EG oxides 130, dummy gates 132, and gate spacers 136) shown in FIG. 1 extend over and around a portion of the substrate 102 in the EG device region 180.

Turning now to FIG. 1, an initial set of fabrication operations have been used to form the IC wafer 100 configured and arranged as shown. At the fabrication stage depicted in FIG. 1, the IC wafer 100 includes a substrate 102. In the illustrated embodiments of the invention, the substrate 102 includes a bulk silicon material. Alternatively, the substrate 102 can be implemented in a semiconductor-on-insulator (SOI) configuration. Other suitable semiconductor materials can be used as the substrate 102, including but not limited to monocrystalline Si, SiGe, III-V compound semiconductors, II-VI compound semiconductors, and the like. In some embodiments of the invention where the substrate 102 is an SOI configuration, the substrate 102 includes a buried oxide layer (not depicted). The buried oxide layer can be made of any suitable dielectric material, such as, for example, a silicon oxide.

The fabrication operations used to form the IC wafer 100 shown in FIG. 1 begins by forming the substrate 102 and blocking the EG device region 180 of the substrate 102. The EG device region 180 can be blocked by depositing a blocking mask (not shown) only over the EG device region 180 of the substrate 102. In embodiments of the invention, the blocking mask can be an organic planarization layer (OPL). In general, OPLs are used as etch masks for pattern transfers into inorganic substrates, to fill pre-existing features, and to planarize the substrate to allow for larger patterning process windows. After the blocking mask 802 is formed, known fabrication operations are used to recess the substrate 102 in the nanosheet region 110 and the embedded memory region 150.

A bottommost nanosheet layer 112 is formed on the substrate 102 in the nanosheet region 110 and the embedded memory region 150. The bottommost nanosheet layer 112 can be made of any suitable sacrificial material, such as, for example, SiGe. In some embodiments of the invention, the Ge concentration in the bottommost nanosheet layer 112 is selected to ensure etch selectivity against any Si, SiGe, or Ge layer that is subsequently formed in the nanosheet region 110 and the embedded memory region 150 of the substrate 102. In some embodiments of the invention, the Ge concentration in the bottommost nanosheet layer 112 is at least about 15% higher than the Ge concentration in any SiGe layer that is subsequently formed in the nanosheet region 110 and the embedded memory region 150 of the substrate 102. In some embodiments of the invention, the bottommost nanosheet layer 112 can include a Ge concentration from about 45% to about 70%. In the embodiments of the invention depicted in FIG. 1, the Ge concentration of the bottommost nanosheet layer 112 is about 50%, although other Ge concentrations are within the contemplated scope of the invention. As shown in FIG. 1, the notation "SiGe50%" is used to indicate that about 40% of the SiGe material is Ge and about 50% of the SiGe material is Si. Similarly, the notation SiGe35% used in FIG. 1 indicates that about 35% of the SiGe material is Ge and about 65% of the SiGe material is Si.

The bottommost nanosheet layer 212 can be formed using a variety of methods, including, for example, chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and molecular beam epitaxy (MBE). In some embodiments of the invention, the bottommost nanosheet layer 212 can be epitaxially grown from gaseous or liquid precursors. Epitaxial semiconductor materials can be grown using vapor-phase epitaxy (VPE), MBE, liquid-phase epitaxy (LPE), or other suitable processes.

A stack of alternating layers of sacrificial nanosheets 114, 116, 118 and channel nanosheets 124, 126, 128 is formed over the bottommost nanosheet layer 112 in the regions 110, 150. In some embodiments of the invention, the sacrificial nanosheet layers 114, 116, 118 are SiGe and be within a range from about SiGe 20% to about SiGe 40%. In the embodiments of the invention depicted in FIG. 1, the sacrificial nanosheet layers 114, 116, 118 are about SiGe 35%. In some embodiments of the invention, the channel nanosheets 124, 126, 128 are Si. In embodiments of the invention, the alternating layers of sacrificial nanosheets 114, 116, 118 and channel nanosheets 124, 126, 128 depicted in FIG. 1 can be formed by epitaxially growing one layer and then the next until the desired number and desired thicknesses of the sacrificial/channel nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

After fabrication of the alternating layers of the sacrificial nanosheets 114, 116, 118 and the channel nanosheets 124, 126, 128 in the nanosheet region 110 and the embedded memory region 150, the blocking mask (not shown) is removed from the EG device region 180, the wafer 100 is planarized, and an EG oxide layer (not shown) is deposited everywhere over and around the nanosheet region 110, the embedded memory region 150, and the EG device region 180 of the substrate 102. In embodiments of the invention, the EG oxide layer is relatively thick (e.g., from about 1 nm to about 10 nm). The thickness of the EG oxide layer is selected to increase the $V_T$ that can be tolerated by the EG devices that will be formed in the EG device region 180. The EG oxide layer, which will be etched in subsequent fabrication operations to form the EG oxide regions 130, can be deposited conformally using any suitable conformal deposition process (e.g., atomic layer depositions (ALD)), and can include interfacial layers (IL) and high-k dielectric layers. In some embodiments of the invention, the high-k dielectric layers can modify the work function of the final gate structure 902 (shown in FIG. 13) of EG devices in the EG device region 180 of the substrate 102. The high-k dielectric layer can be made of, for example, silicon oxide, silicon nitride, silicon oxynitride, boron nitride, high-k materials, or any combination of these materials. Examples of other high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

A layer of amorphous silicon (a-Si) (not shown) is deposited over the EG oxide layer. The a-Si layer is planarized then patterned (e.g., using hard masks 134) and etched using, for example, a dry etch, or a combination of sequential dry and wet etches to form the dummy gates 132. In accordance with aspects of the invention, the hard mask 134 in the EG device region 180 is patterned to define a larger footprint than the hard masks 134 in the nanosheet region 110 and the embedded memory region 150 in order to define a larger volume of the dummy gate 132 in the EG device region 180. The portions of the EG oxide layer that are not under the dummy gates 132 are removed using any suitable removal process to form the EG oxide regions 130. The gate spacers 136 are formed on sidewalls of the hard masks 134, the dummy gates 132 and the EG oxide regions 130 using, for example, CVD, PECVD, ALD, PVD, chemical solution deposition, or other like processes in combination with a wet or dry etch process. In embodiments of the invention, the gate spacers 136 can be SiN, SiBCN, or other similar materials.

Figure 2:
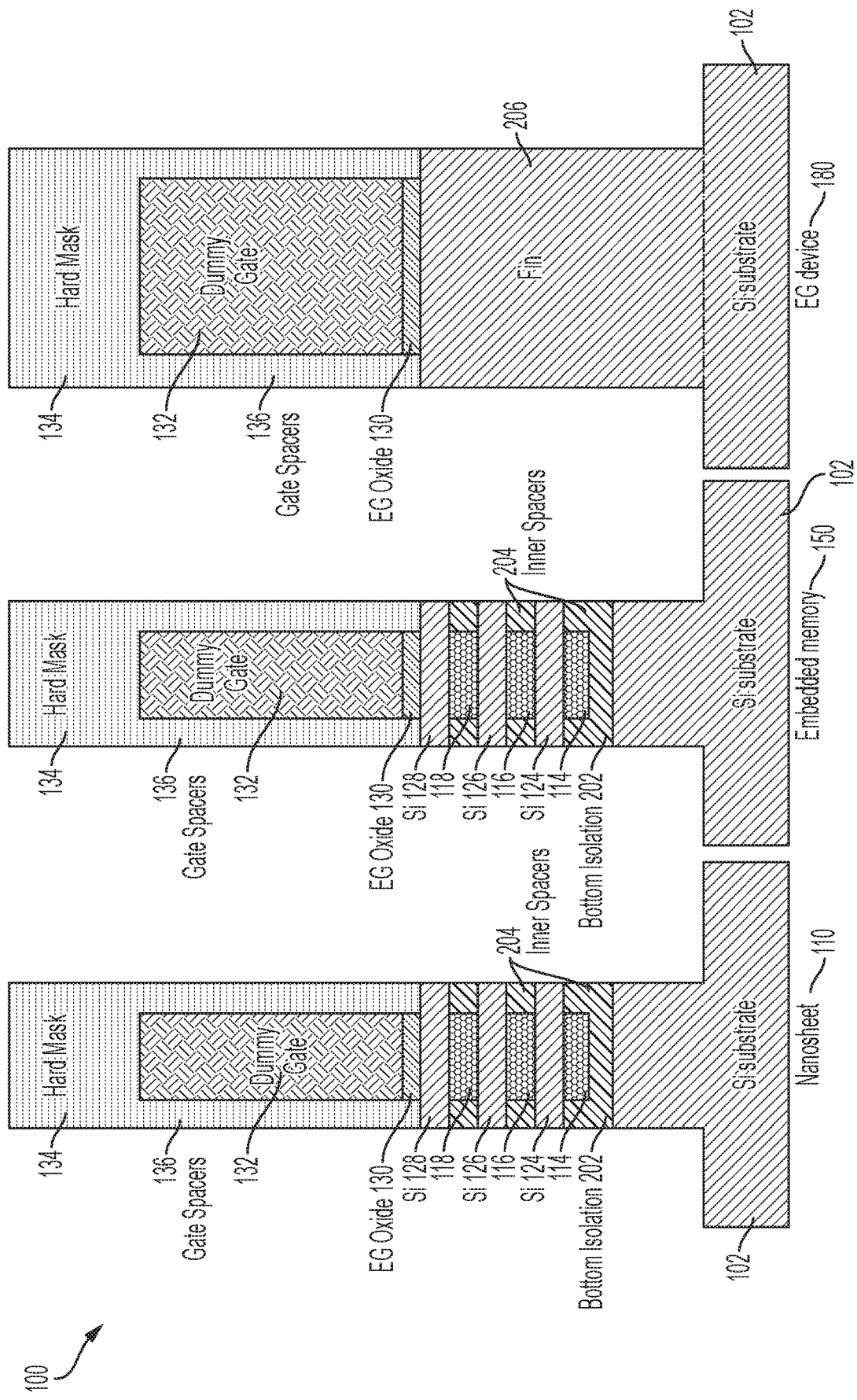

In FIG. 2, the hard masks 134 and the gate spacers 136 have been used as a mask, and wet or dry etch processes have been applied in order to etch portions of the wafer 100 that are not covered by the hard masks 134 and the gate spacers 136. In the EG device region 180, the etch processes are applied to the exposed portions of the substrate 102 to form the fin region 206. In the embedded memory region 150 and the nanosheet region 110, the etch processes are applied to the exposed portions of the channel nanosheets layers 128, 126, 124, the sacrificial nanosheet layer 118, 116, 114, the bottommost layer 112 (shown in FIG. 1) and top portions of the substrate 102 to form fin-shaped columns under the hard masks 134 and the gate spacers 136 in the embedded memory region 150 and the nanosheet region 110. Each of the fin-shaped columns in the embedded memory region 150 and in the nanosheet region 110 includes the channel nanosheets layers 128, 126, 124, the sacrificial nanosheet layer 118, 116, 114, the bottommost layer 112 (shown in FIG. 1) and a top portion of the substrate 102.

As shown in FIG. 2, known semiconductor fabrication processes have been used to remove the bottommost layer 112 (shown in FIG. 1) and partially remove end regions of the SiGe sacrificial nanosheet regions 114, 116, 118. In embodiments of the invention, the bottommost layer 112 is formed from SiGe50%, which can be selectively etched with respect to the Si and SiGe35% using, for example, vapor phase HCl. In embodiments of the invention, the end regions of the SiGe sacrificial nanosheets 114, 116, 118 can be removed using a first application of a so-called "pull-back" process to pull the SiGe nanosheet regions 112A, 114B, 116B, 112C, 402E back an initial pull-back distance such that the end regions terminate underneath the offset gate spacers 136. In embodiments of the invention, the pull-back process includes a hydrogen chloride (HCL) gas isotropic etch process, which etches SiGe without attacking Si.

Referring still to FIG. 2, the EG device region 180 has been covered by a blocking mask (not shown), and known semiconductor device fabrication processes have been used to form bottom isolation regions 202 in the spaces that were occupied by the removed bottommost layers 112 (shown in FIG. 1), as well as form inner spacers 204 in the spaces that were occupied by the removed end regions of the SiGe sacrificial nanosheets 114, 116, 118. In embodiments of the invention, the bottom isolation regions 202 and the inner spacers 204 can be formed using, e.g., a conformal deposition process and subsequent isotropic or anisotropic etch back to remove excess spacer/isolation material on exposed vertical sidewalls of the wafer 100 and on exposed horizontal surfaces of the substrate 102. The conformally deposited isolation material pinches off in the space that was occupied by the removed bottommost layers 112 to form the bottom isolation region 202. The inner spacers 204 and the bottom isolation regions 202 can be formed of silicon nitride, silicoboron carbonitride, silicon carbonitride, silicon carbon oxynitride, or any other type of dielectric material (e.g., a dielectric material having a dielectric constant k of less than about 5).

Figure 3:
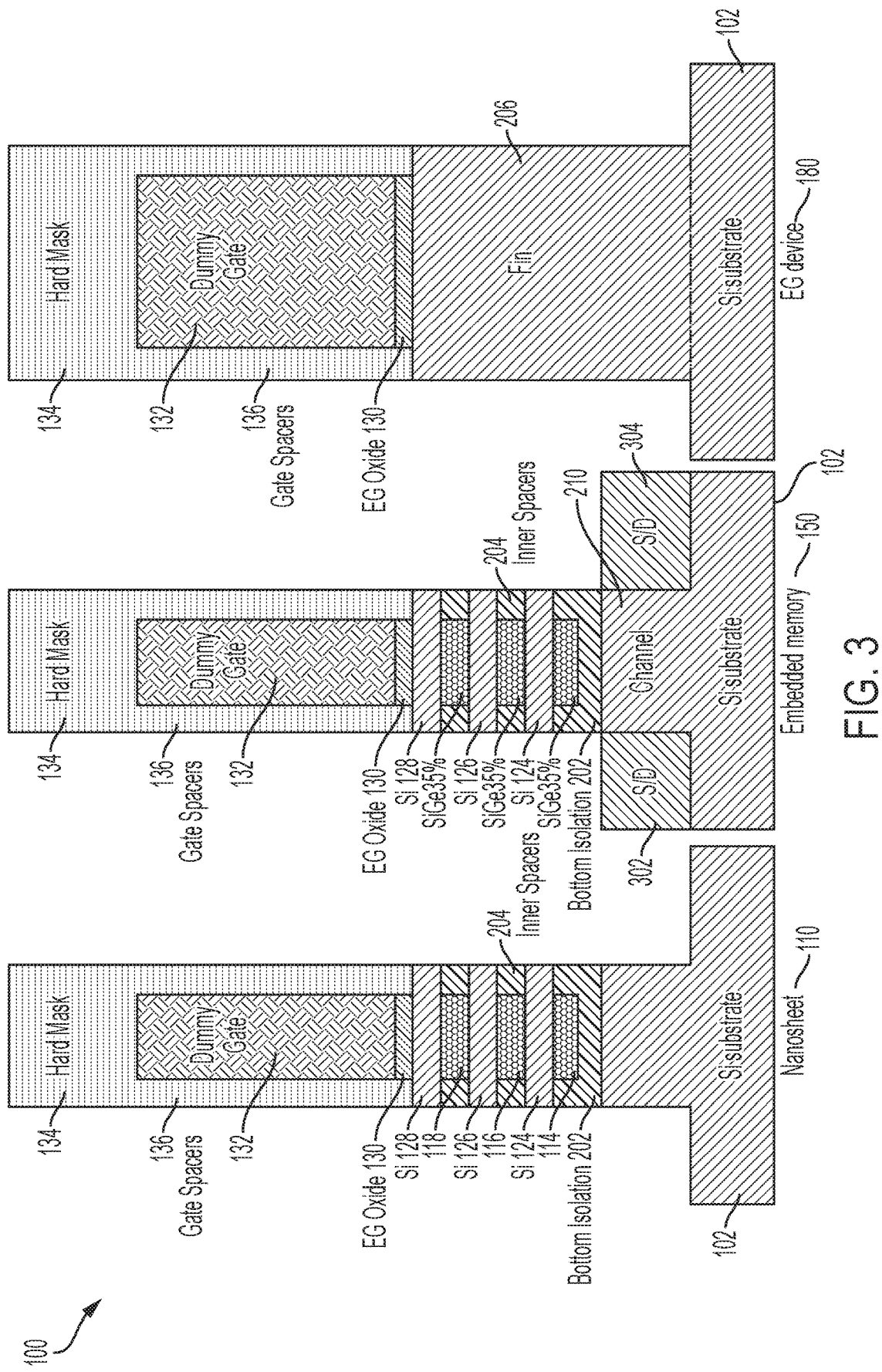

In FIG. 3, the nanosheet region 110 has been covered by a blocking mask (now shown) such that both the nanosheet region 110 and the EG device region 180 are covered by blocking masks. Known semiconductor device fabrication processes are used to form raised source/drain (S/D) regions 302, 304 on exposed horizontal and vertical surfaces of the substrate 102 in the embedded memory region 150. In embodiments of the invention, the raised S/D regions 302, 304 are formed using an epitaxial layer growth process on the exposed horizontal and vertical surfaces of the substrate 102. In-situ doping (ISD) is applied to doped the S/D regions 302, 304, thereby creating the necessary junctions for transistor functionality that will be present in the embedded memory region 150. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

The portion of the substrate 202 that is between the S/D regions 302, 304 forms a channel region 310. In embodiments of the invention, the epitaxial growth and in-situ doping used to form the raised S/D regions 302, 304 are controlled in a manner that forms extension regions (not shown) having extension junctions (not shown) within the channel 310.

Figure 4:
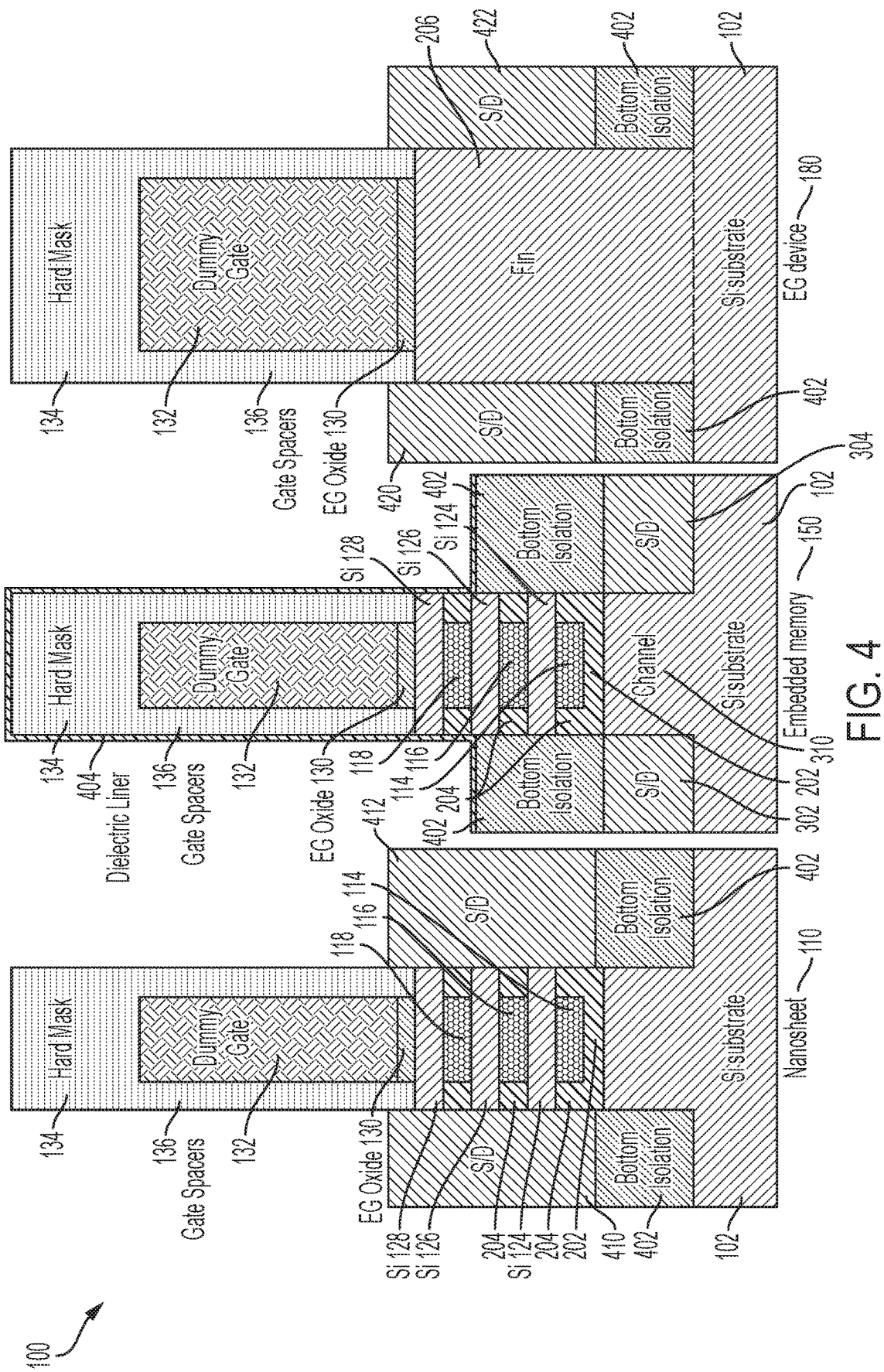

In FIG. 4, the blocking masks have been removed from the nanosheet region 110 and the EG device region 180, and known fabrication operations have been used to deposit dielectric material (e.g., $SiO_2$) in the nanosheet region 110, the embedded memory region 150, and the EG device region 180, thereby forming bottom isolation regions 402. Known fabrication operations are used to deposit a dielectric liner 404 over the wafer 100. The embedded memory region 150 is masked (not shown) then the dielectric liner 404 is removed/stripped from the unmasked nanosheet region 110 and the EG device region 180. The mask is removed from the embedded memory region 150, and known fabrication operations are used to epitaxially grow raised S/D regions 410, 412 in the nanosheet region 110, as well as raised S/D regions 420, 422 in the EG device region 180. The dielectric liner 404 in the embedded memory region 150 prevents epitaxial growth from occurring in the embedded memory region 150. In embodiments of the invention, the raised S/D regions 410, 412 are formed using an epitaxial layer growth process on the exposed ends of the Si channel nanosheets 124, 126, 128. In-situ doping is applied to form doped S/D regions 410, 412, thereby creating the necessary junctions for the nanosheet transistors that will be formed in the nanosheet region 110.

In embodiments of the invention, the epitaxial growth and in-situ doping used to form the raised S/D regions 410, 412 are controlled in a manner that forms extension regions (not shown) having extension junctions (not shown) within the Si channel nanosheets 124, 126, 128. Extension junctions 912, 922 reduce the $R_{ext}$ of the nanosheet transistors that will be formed in the nanosheet region 110 of the substrate 102. The extension junctions also form a conducting path between the S/D regions 410, 412 and the Si channel nanosheet regions 124, 126, 128. In embodiments of the invention, substantially the same epitaxial growth and in-situ doping processes can be used to form the raised S/D regions 420, 422, extension regions (not shown), and the extension junctions (not shown) in the upper (or active) portions of fin 206. The upper/active portion of the fin 206 positioned between the raised S/D regions 420, 422 functions as a channel region of the EG transistor devices that will be formed in the EG device region 180.

Figure 5:
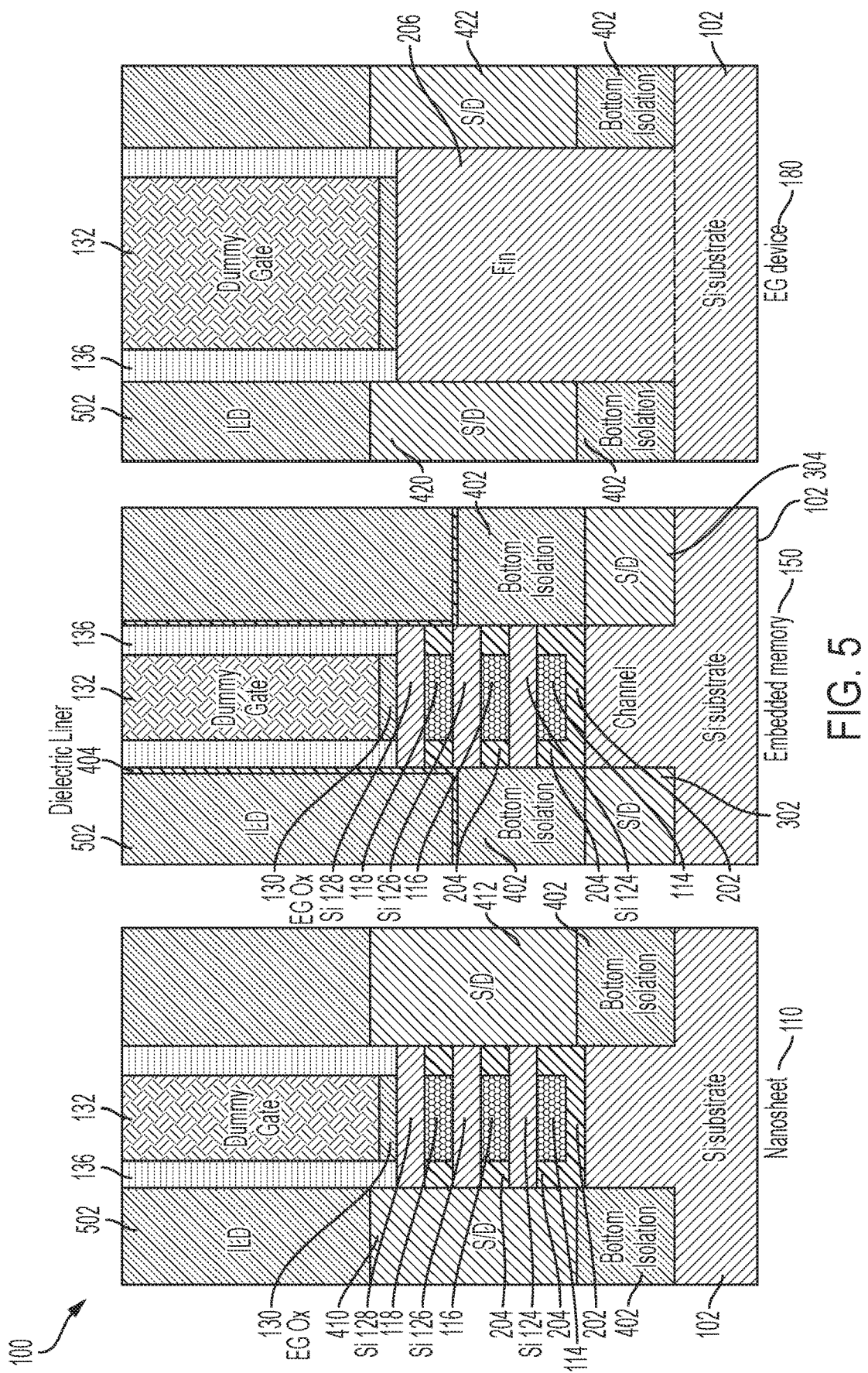

In FIG. 5, the blocking mask has been removed from the embedded memory region 150, and known semiconductor fabrication operations have been used to form a protective interlayer dielectric (ILD) region 502. The ILD region 502 can be formed by depositing an oxide material in bulk (e.g., silicon dioxide) and polishing the bulk oxide back (e.g., using CMP) to remove the hard masks 134 and expose top surfaces of the dummy gates 132.

Figure 6:
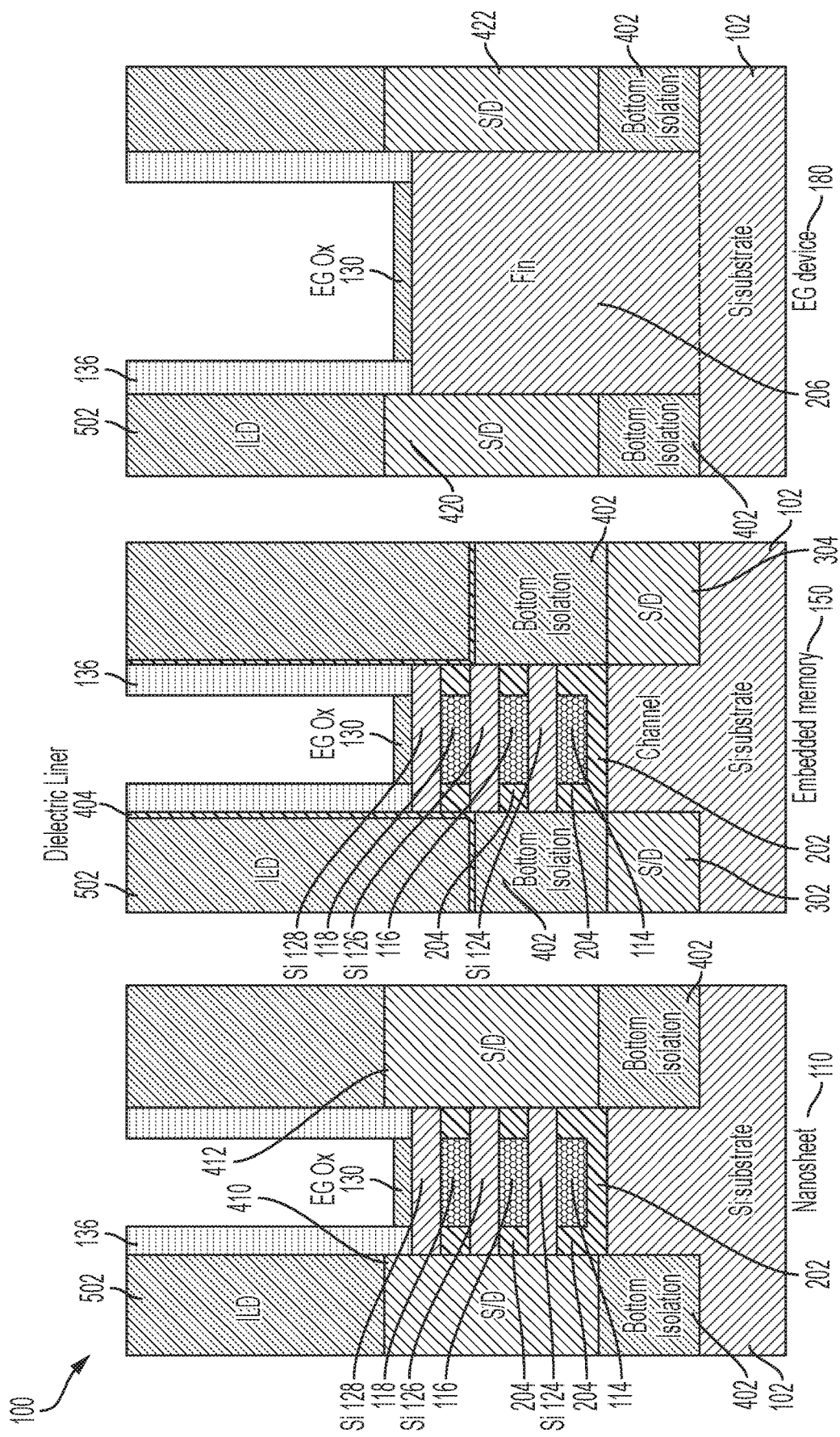

In FIG. 6, the dummy gates 132 have been removed. The dummy gates 132 can be removed by a known etching process, e.g., RIE or chemical oxide removal (COR).

Figure 7:
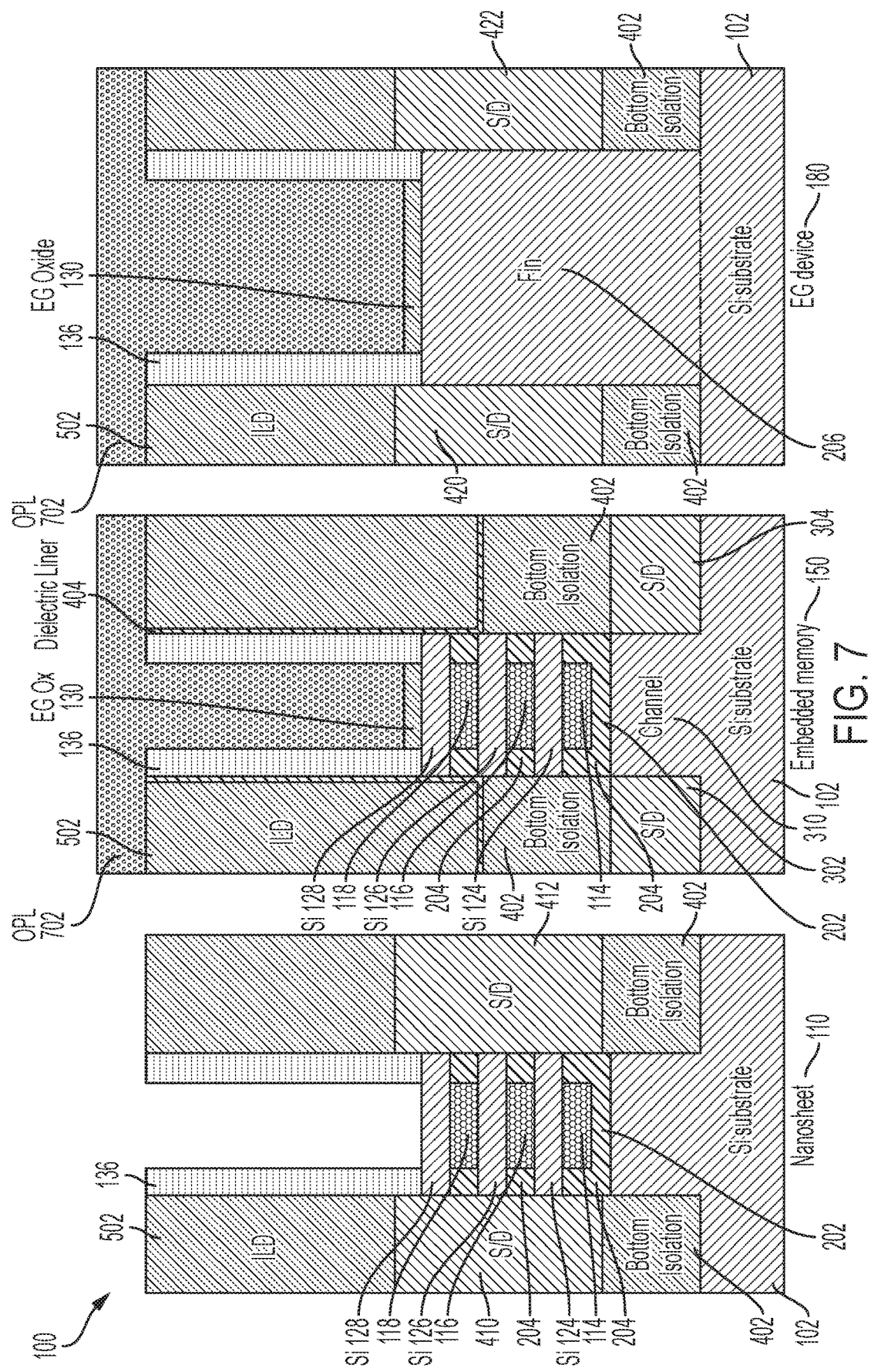

In FIG. 7, blocking masks 702 have been deposited over the embedded memory region 150 and the EG device region 180, and known semiconductor fabrication operations have been used to remove the EG oxide 130 from the nanosheet region 110.

Figure 8:
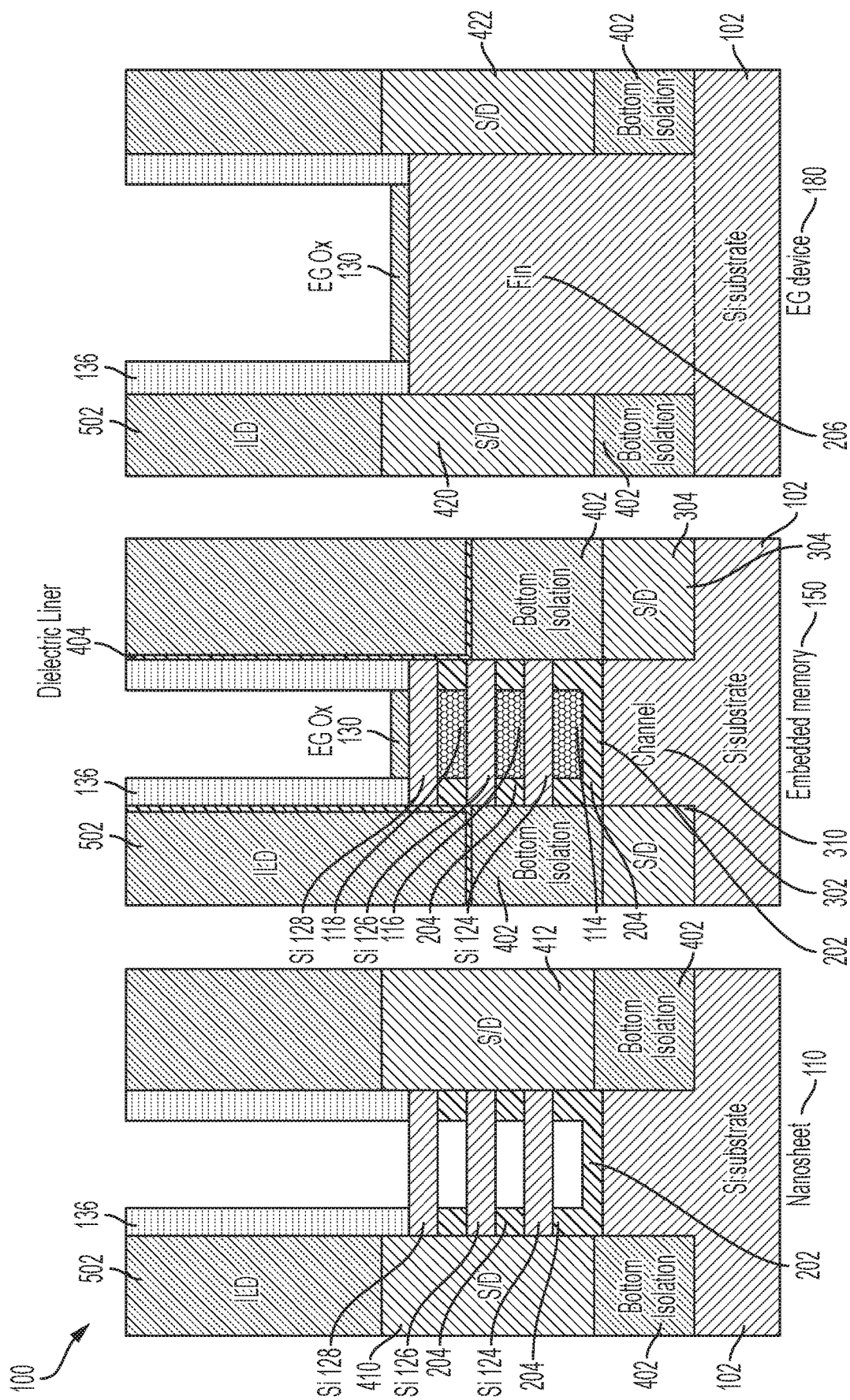

In FIG. 8, known semiconductor fabrication operations have been used to remove the SiGe sacrificial nanosheets 124, 126, 128 from the nanosheet region 110. In embodiments of the invention, the SiGe sacrificial nanosheet regions 124, 126, 128 can be removed by applying a selective etch (e.g., a hydrochloric acid (HCl)). The blocking masks 702 (shown in FIG. 7) are removed after the sacrificial nanosheet regions 124, 126, 128 have been removed.

Figure 9:
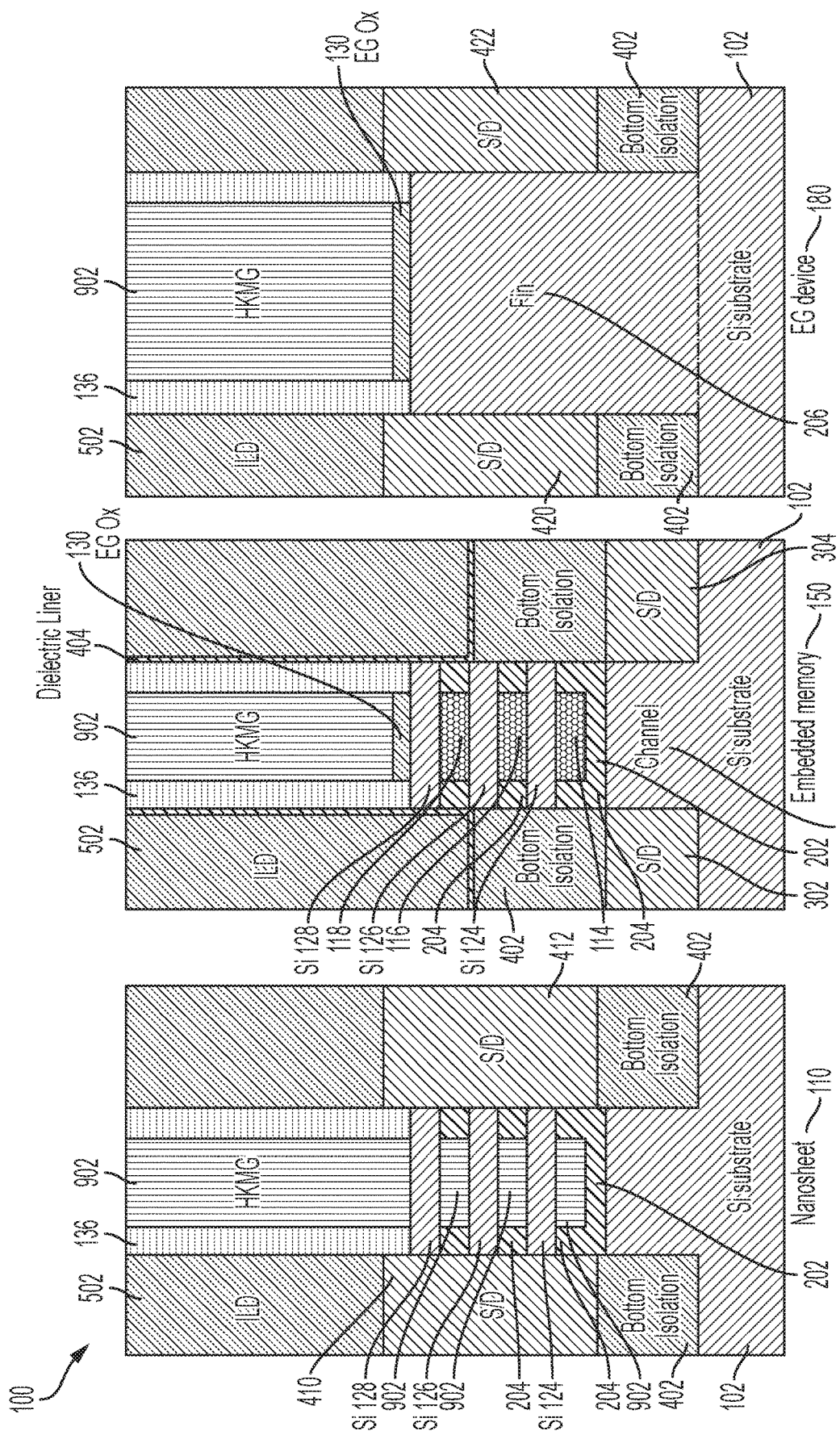

In FIG. 9, known semiconductor fabrication processes (e.g., a gate-late fabrication process) have been used to form high-k metal gate (HKMG) regions 902 in the open spaces of the nanosheet region 110, the embedded memory region 150, and the EG device region 180. The HKMG regions 902 include high-k dielectric layers and multi-segmented metal gate structures. In embodiments of the invention, the metal gate structures can include metal liners (not shown) and work-function metals (WFMs) (not shown). In embodiments of the invention, the WFM can be, for example, TiN or TaN, and the metal gate 1404 can be aluminum or tungsten. In the nanosheet region 110, HKMG 902 surround the stacked Si nanosheet channel regions 124, 126, 128 and regulate electron flow through the Si nanosheet channel regions 124, 126, 128 between the raised S/D region 410 and the raised S/D region 412.

Figure 10:
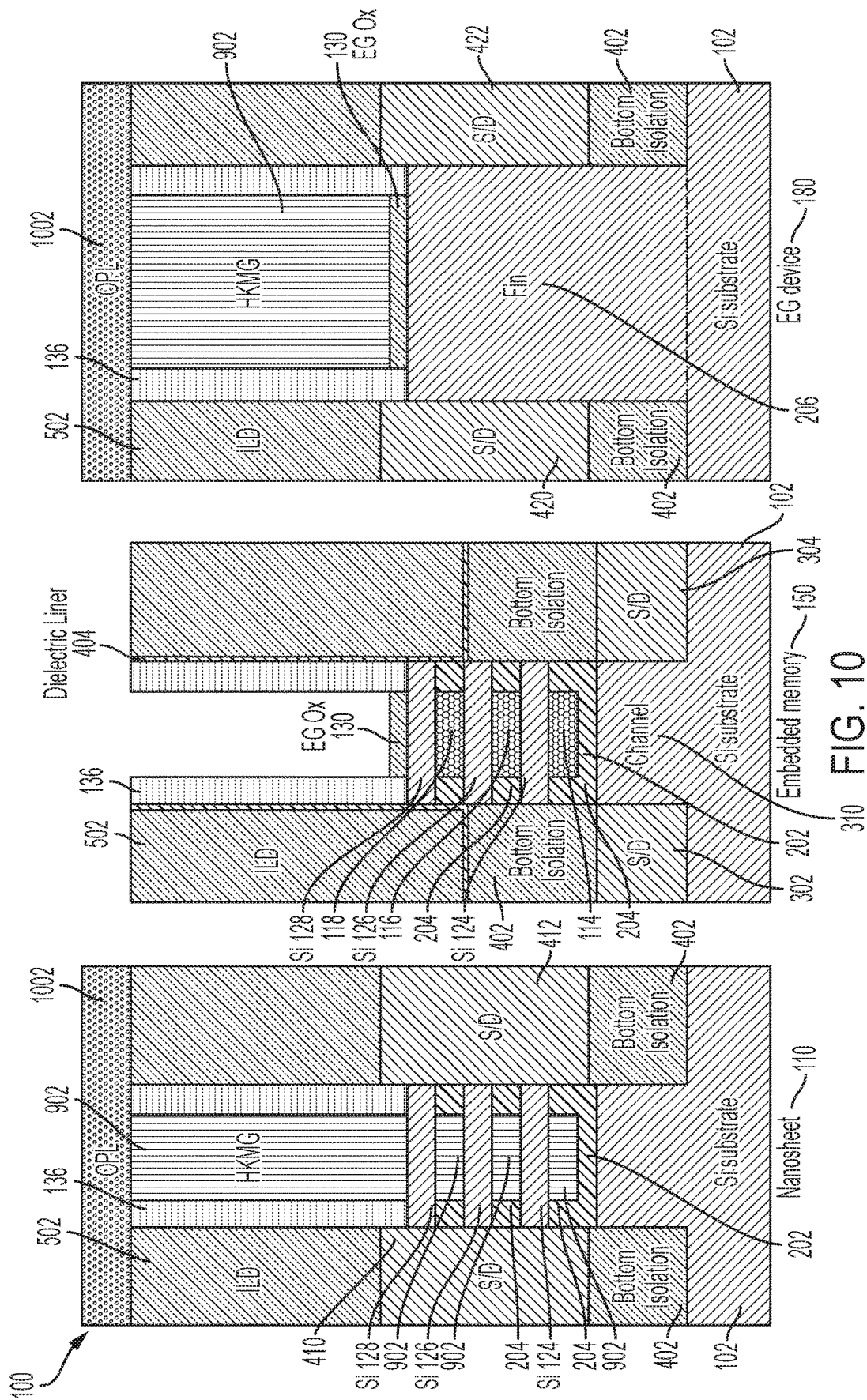

In FIG. 10, blocking masks 1002 have been deposited to cover the nanosheet region 110 and the EG device region 180, and known semiconductor fabrication operations have been used to remove the HKMG region 902 from the embedded memory region 150, thereby exposing the EG oxide region 130 in the embedded memory 150.

Figure 11:
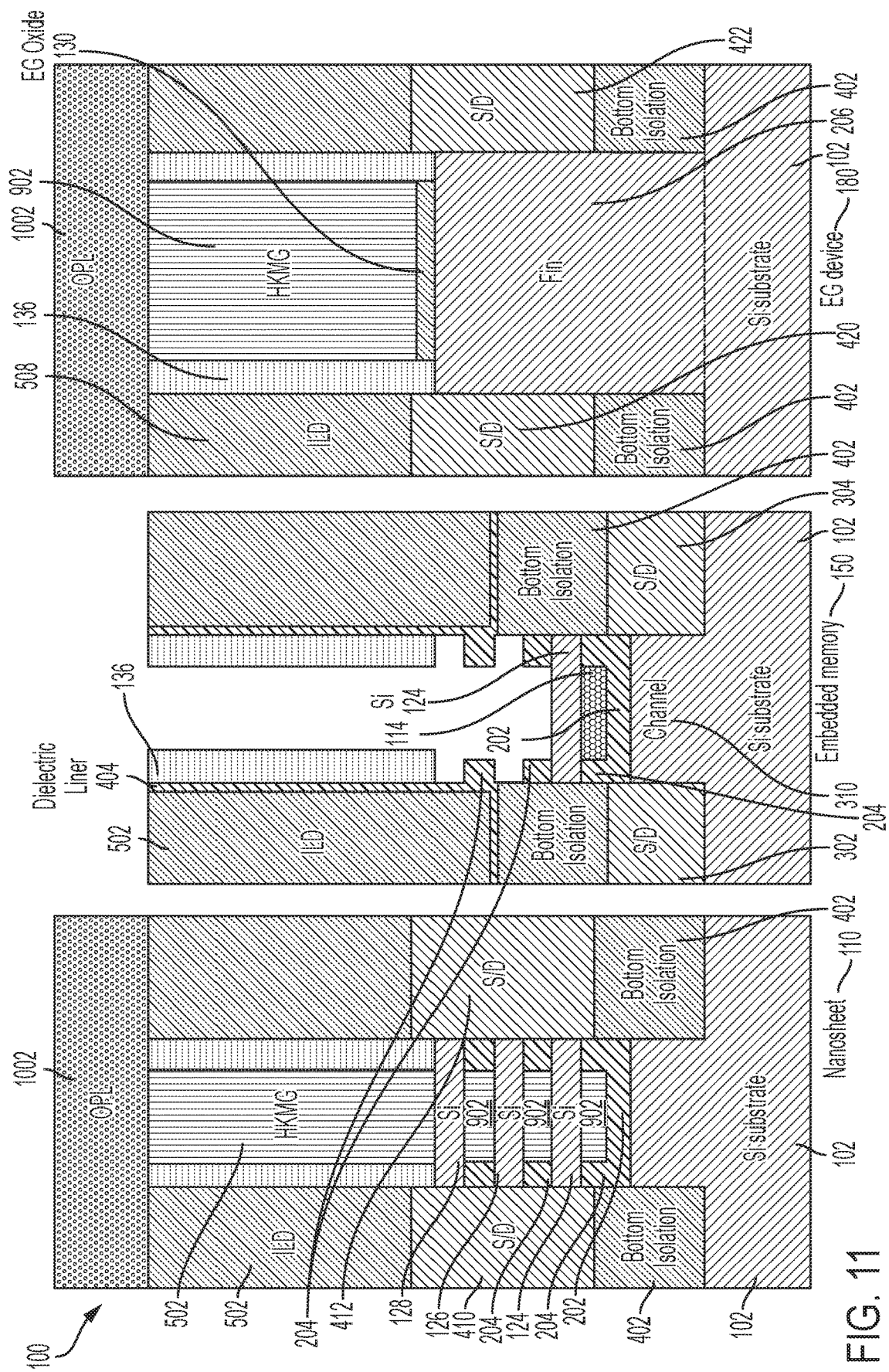

In FIG. 11, known semiconductor fabrication operations have been used to selectively and sequentially remove the EG oxide region 130, the Si channel nanosheet layer 128, the SiGe sacrificial nanosheet layer 118, the Si channel nanosheet layer 126, and the SiGe sacrificial nanosheet layer 116 from the embedded memory region 150.

Figure 12:
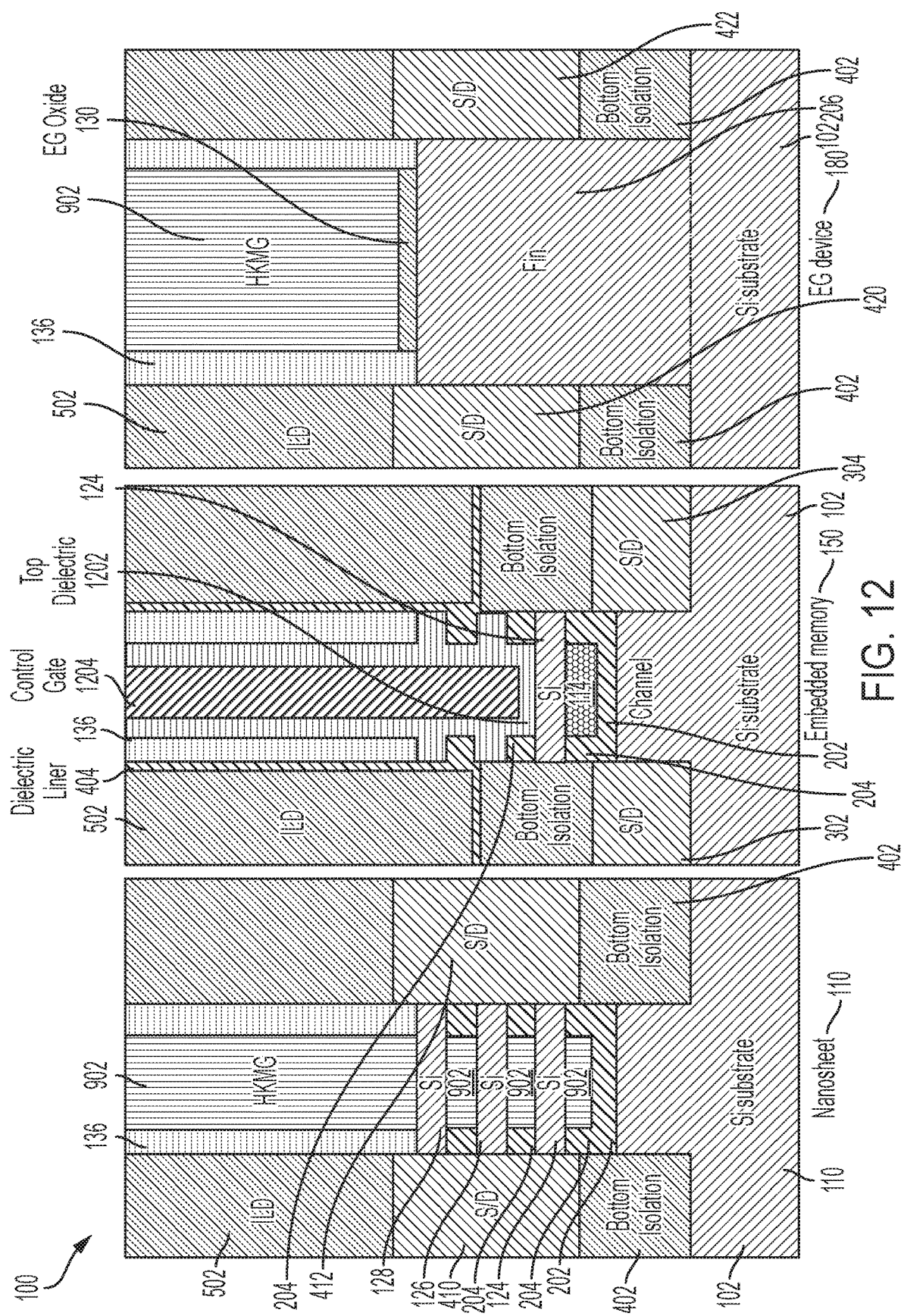

In FIG. 12, known semiconductor fabrication operations have been used to conformally deposit a top dielectric layer 1202 that will function as the top tunneling oxide of the embedded memory devices formed in the embedded memory region 150 of the substrate 102. Known fabrication operations have been used to deposit a control gate metal that will form the control gate 1204 of the embedded memory devices formed in the embedded memory region 150 of the substrate 102. After forming the top dielectric 1202 and the control gate 1204, the blocking masks 1002 (shown in FIG. 11) are removed. Thus, the IC wafer 100 in FIG. 12 depicts a completed nanoshect transistor device in the nanosheet region 110, a completed on-chip embedded memory device in the embedded memory region 150, and a completed EG device (in the form of an EG FinFET device) in the EG device region 180.

Figure 13:
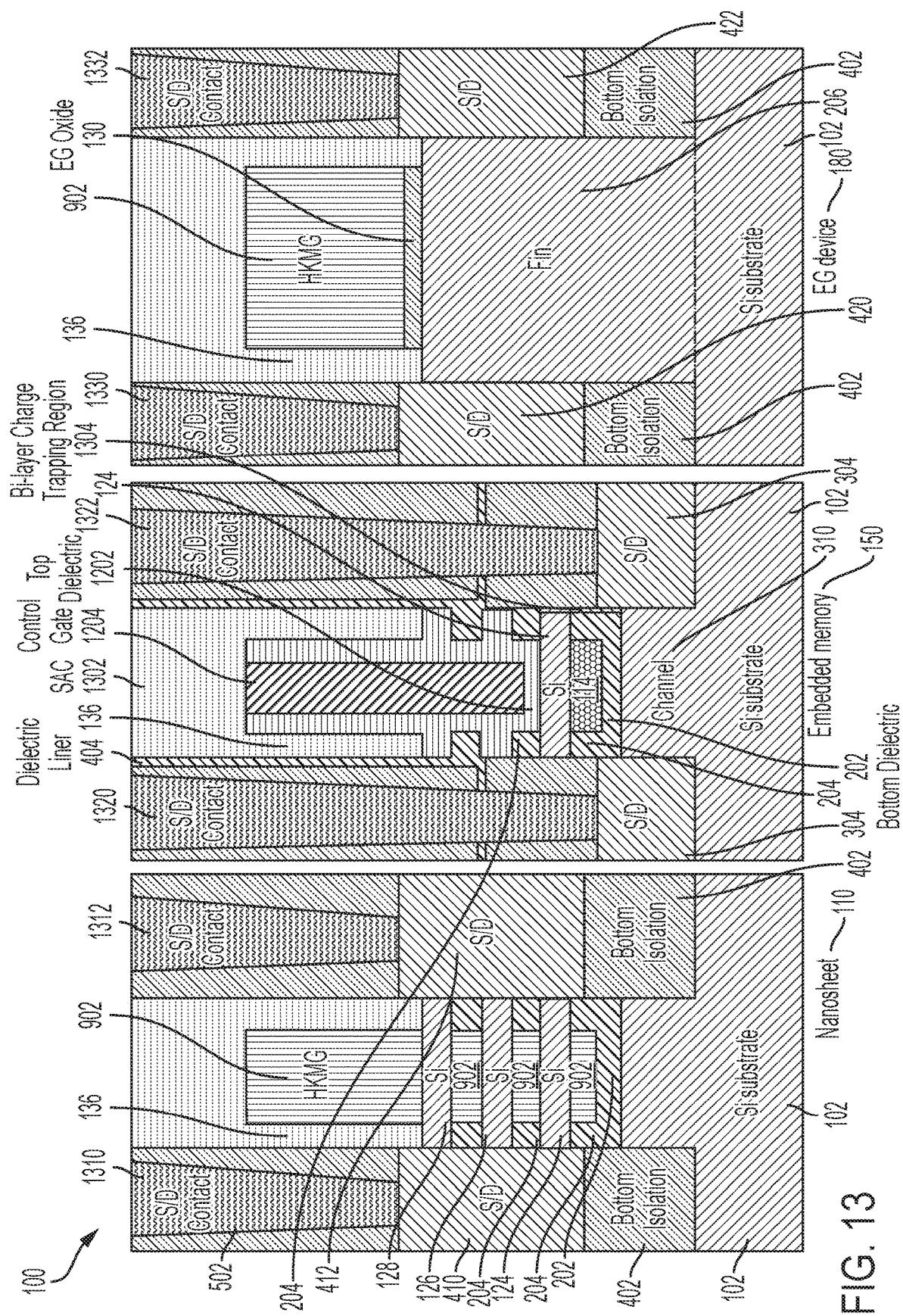

The on-chip embedded memory device in the region 150 is a floating gate embedded memory architecture having a floating gate formed from a unique bi-layer charge trapping region 1304 (shown in FIG. 13). The bi-layer charge trapping region 1304 is formed from the Si nanosheet 124 and the SiGe35% nanosheet 114. The bi-layer charge trapping layer 1304 is floating in that the Si nanosheet 124 and the SiGe35% nanosheet 114 are floating and not electrically connected to anything. In accordance with aspects of the invention, forming the bi-layer charge trapping region 1304 from nanosheets 124, 114 generates additional trapping sites (compared to a unitary charge trapping structure) at the interface between the nanosheet layers 124, 114, which makes it easier for the bi-layer charge trapping layer 1304 to charges, which allows the bi-layer charge trapping layer 1304 to more easily trap charges (compared to a unitary charge trapping structure) The floating gate embedded memory is essentially a storage transistor formed from the S/D region 302, the channel 310, the S/D region 304, the control gate 1202, the bi-layer charge trapping region 1304 (i.e., a floating gate), the top dielectric 1202 (i.e., a gate oxide), and the bottom dielectric 202 (i.e., a tunnel oxide). Electrons are added to or removed from the bi-layer charge trapping region 1304 to change the storage transistor's $V_T$. Changing $V_T$ affects whether a memory cell is programmed as a zero (0) or a one (1). A process known as Fowler-Nordheim tunneling removes electrons from the bi-layer charge trapping region 1304. Either Fowler-Nordheim tunneling or a phenomenon known as channel hot-electron injection traps the electrons in the bi-layer charge trapping region 1304.

Using Fowler-Nordheim tunneling, data is erased via a strong negative charge on the control gate 1204. This forces electrons into the channel 310 where a strong positive charge exists. The reverse happens when using Fowler-Nordheim tunneling to trap electrons in the bi-layer charge trapping region 1304. Electrons manage to forge through the relatively thin bottom dielectric 202 to the bi-layer charge trapping region 1304 in the presence of a high electric field, with a strong negative charge on the S/D regions 302, 304 and a strong positive charge on the control gate 1204.

Channel hot-electron injection, also known as hot-carrier injection, enables electrons to break through the top dielectric 1202 and change $V_T$ of the bi-layer charge trapping region 1304. This breakthrough occurs when electrons acquire a sufficient amount of energy from the high current in the channel 310 and the attracting charge on the control gate 1204. Electrons are trapped in the bi-layer charge trapping region 1304 whether or not a device containing the floating gate memory cell is receiving power as a result of electrical isolation created by the dielectric layers that surround the bi-layer charge trapping region 1304. This characteristic enables floating gate memory to provide persistent storage.

In FIG. 13, known fabrication operations have been used to form S/D contacts 1310, 1312, 1320, 1322, 1330, 1332 and self-aligned caps (SACs) 1302, configured and arranged as shown. In the nanosheet region 110 and the EG device region 180, the SACs 1302 are formed by recessing the HKMGs 902 and depositing the material that forms the SACs 1302 in the space between the gate spacers 136. In the embedded memory region 150, the SACs 1302 are formed by recessing the control gage 1204 and the top dielectric 1202 and depositing the material that forms the SACs 1302 in the space between the gate spacers 136. In embodiments of the invention, the SACs 1302 can be the same or different material than the gate spacers 136. The SACs 1302 can be deposited using, for example, CVD, PECVD, ALD, PVD, chemical solution deposition, or other like processes. In embodiments of the invention, the SACs 1302 can be SiN, SiBCN, or other similar materials.

In the nanosheet region 110 and the EG device region 180, the S/D contacts 1310, 1312, 1330, 1332 are formed by forming S/D trenches (not shown) through the ILD regions 502 and filling the S/D trenches with a liner/barrier and conductive material (e.g., a trench silicide) using, for example, a chemical/electroplating process to form the S/D contacts 1310, 1312, 1330, 1332. In the embedded memory region 150, the S/D contacts 1320, 1322 are formed by forming deep S/D trenches (not shown) that extend through the ILD 502 and the bottom isolation 402 and filling the deep S/D trenches with a liner/barrier and conductive material (e.g., a trench silicide) using, for example, a chemical/electroplating process to form the S/D contacts 1320, 1322. After deposition of the S/D contacts 1310, 1312, 1320, 1322, 1330, 1332, the excess metal is removed to form a flat surface for subsequent processing. A cap layer (not shown) can be deposited over the exposed top surface of the S/D contacts 1310, 1312, 1320, 1322, 1330, 1332.

FIGS. 14-20 depict cross-sectional views of a section of an IC wafer 100A after various fabrication operations have been applied to form nanosheet transistor devices (i.e., the logic devices) in a nanosheet region 1410 of a substrate 102, on-chip embedded memory devices in an embedded memory region 1450 of the substrate 102, and EG (i.e., high $V_T$) transistor devices in an EG device region 1480 of the substrate 102 according to embodiments of the invention. Because many of the elements and fabrication operations of the IC wafer 100A are identical to the elements and fabrication operations of the IC wafer 100 shown in FIGS. 1-13, in the interest of brevity, only the elements and fabrication operations that differ the from elements and fabrication operations of the IC wafer 100 shown in FIGS. 1-13 will be described in connection with the detailed description of the of the IC wafer 100A shown in FIGS. 14-20. All elements and fabrication operations depicted in FIGS. 14-20 but not specifically described in this detailed description are identical the corresponding elements and fabrication operations shown in FIGS. 1-13 and described previously herein.

Figure 14:
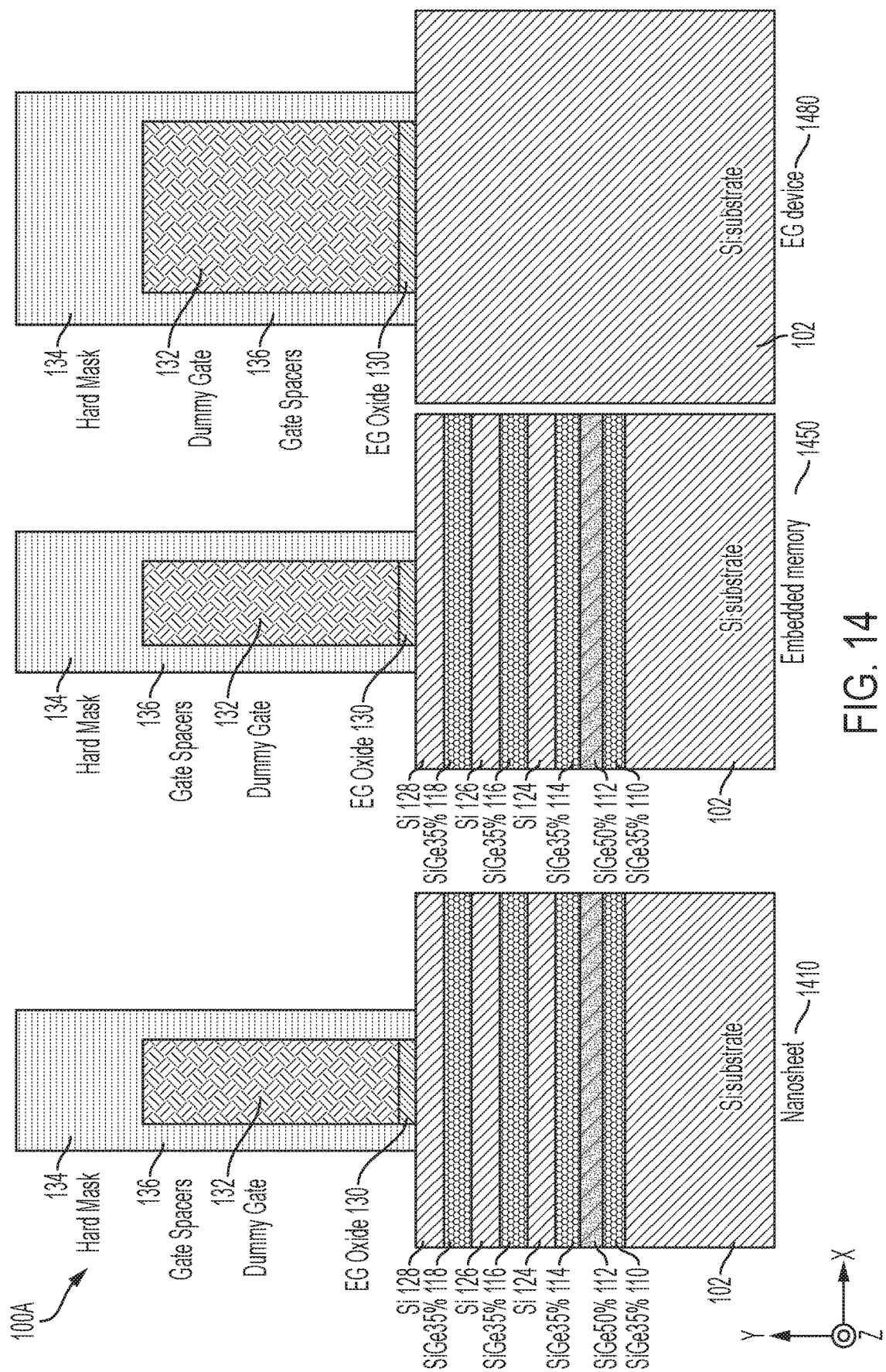

Turning now to FIG. 14, an initial set of fabrication operations have been used to form the IC wafer 100A configured and arranged as shown. Unlike the IC wafer 100 (shown in FIG. 1), an additional SiGe35% nanosheet layer 110 is formed over the substrate 102 in the nanosheet region 1410 and the embedded region 1450. The SiGe35% nanosheet layer 110 is formed prior to forming the SiGe50% bottommost nanosheet layer 112, and the same processes used to form the SiGe50% bottommost nanosheet layer 112 can be used to form the SiGe35% nanosheet layer 110.

Figure 15:
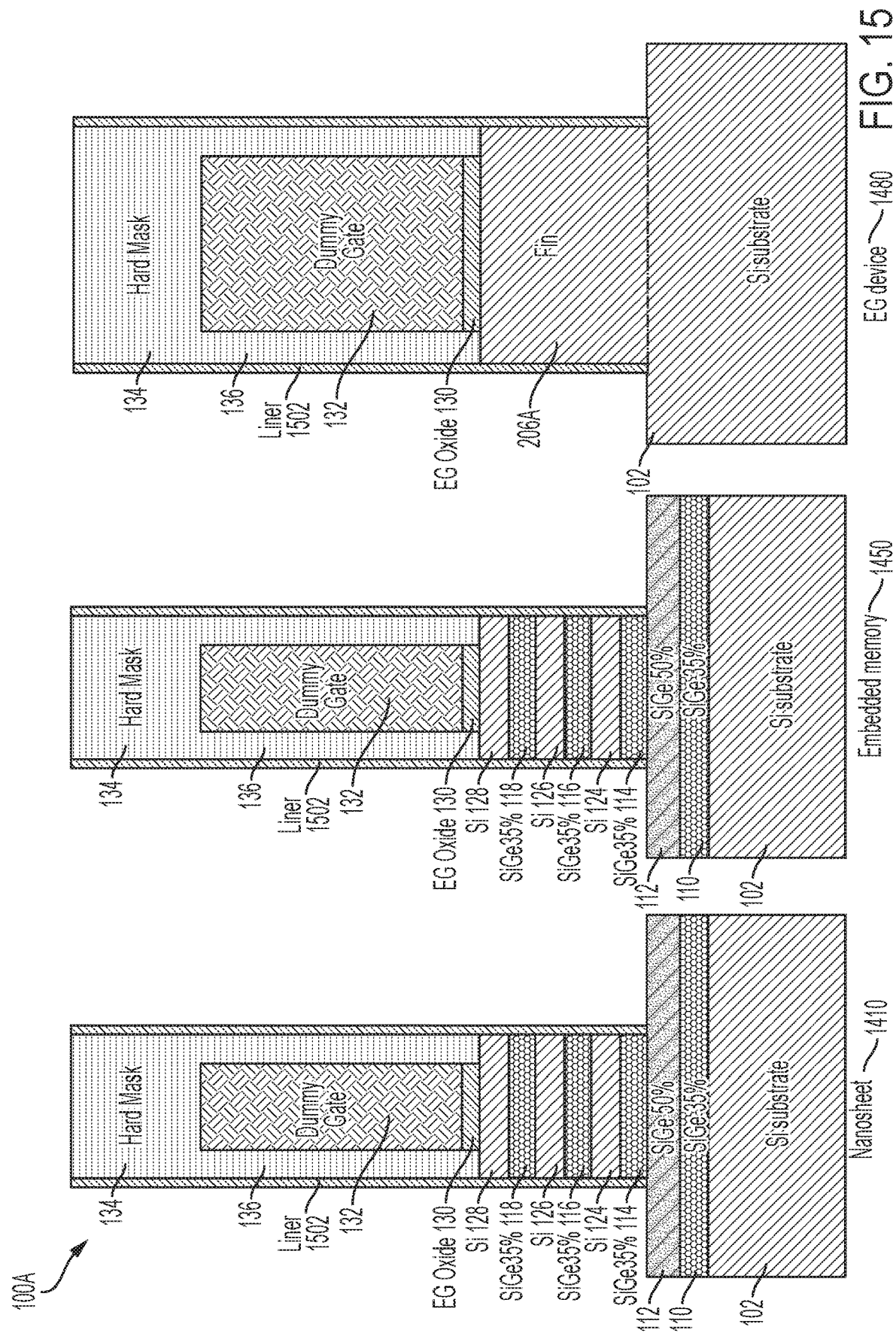

In FIG. 15, the hard masks 134 and the gate spacers 136 have been used as a mask, and wet or dry etch processes have been applied in order to etch portions of the wafer 100A that are not covered by the hard masks 134 and the gate spacers 136. Unlike the IC wafer 100 (shown in FIG. 2), the etch processes are applied in the nanosheet region 1410, the embedded memory region 1450, and the EG device region 1480 to the level of the SiGe50% nanosheet layer 112. A relatively thin protection liner 1502 (e.g., an oxide or a nitride) is conformally deposited over the IC wafer 100A, and an anisotropic RIE is applied to remove the liner 1502 from horizontal surfaces and keep the liner 1502 on vertical sidewall surfaces.

Figure 16:
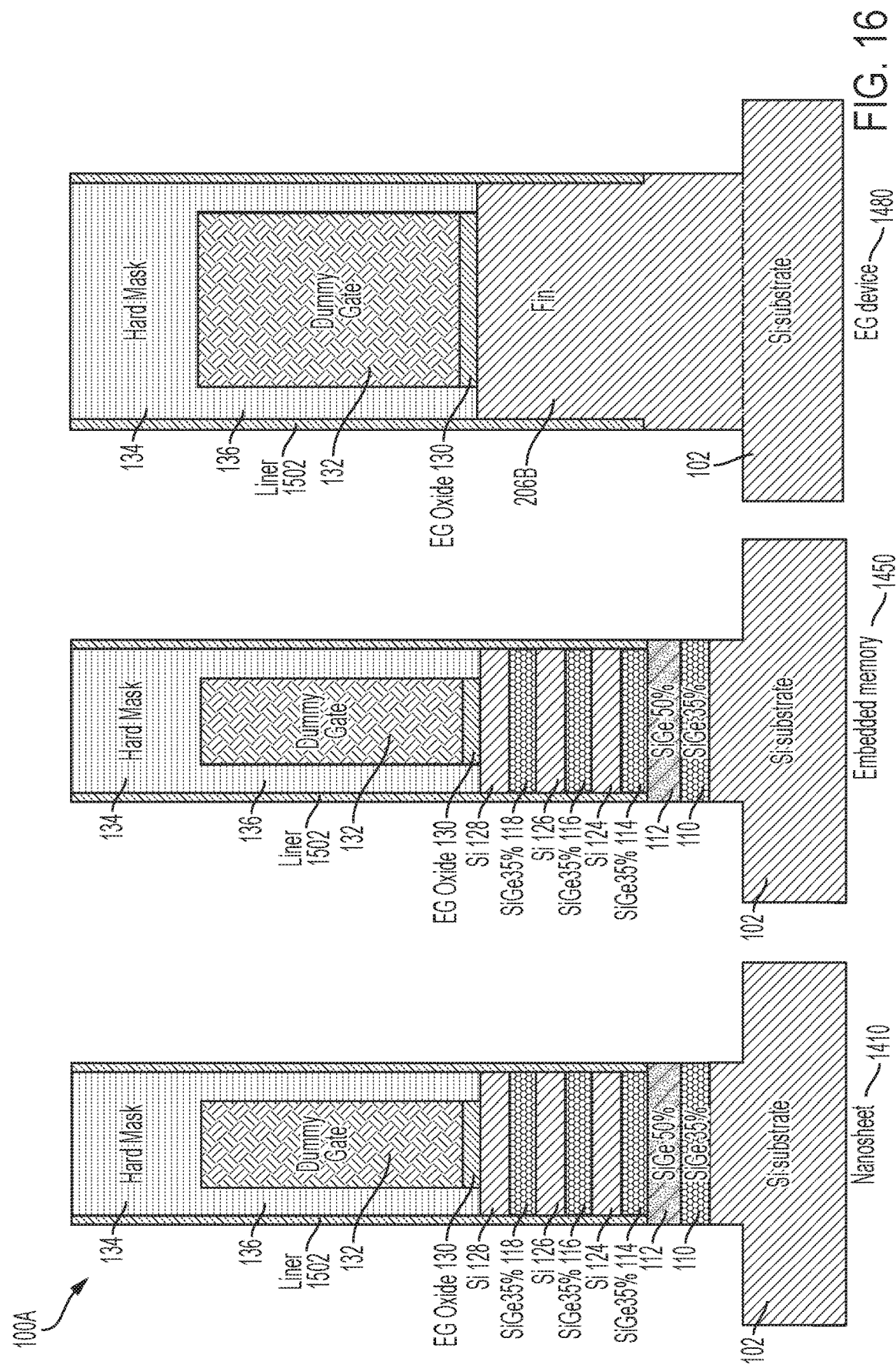

In FIG. 16, the liner 1502 and the hard masks 134 have been used as a mask, and wet or dry etch processes have been applied in order to etch portions of the wafer 100A that are not covered by the liner 1502 and the hard masks 134. In the EG device region 1480, the etch processes are applied to the exposed portions of the substrate 102 to form the fin region 206B. In the embedded memory region 1450 and the nanosheet region 1410, the etch processes are applied to the exposed portions of the SiGe50% nanosheet layer 112, the SiGe35% layer 110, and top portions of the substrate 102 to form fin-shaped columns under the hard masks 134 and the gate spacers 136 in the embedded memory region 1450 and the nanosheet region 1410. Each of the fin-shaped columns in the embedded memory region 150 and in the nanosheet region 110 includes the channel nanosheets layers 128, 126, 124, the sacrificial nanosheet layer 118, 116, 114, the SiGe50% nanosheet layer 112, the SiGe35% nanosheet layer 110, and a top portion of the substrate 102.

Figure 17:
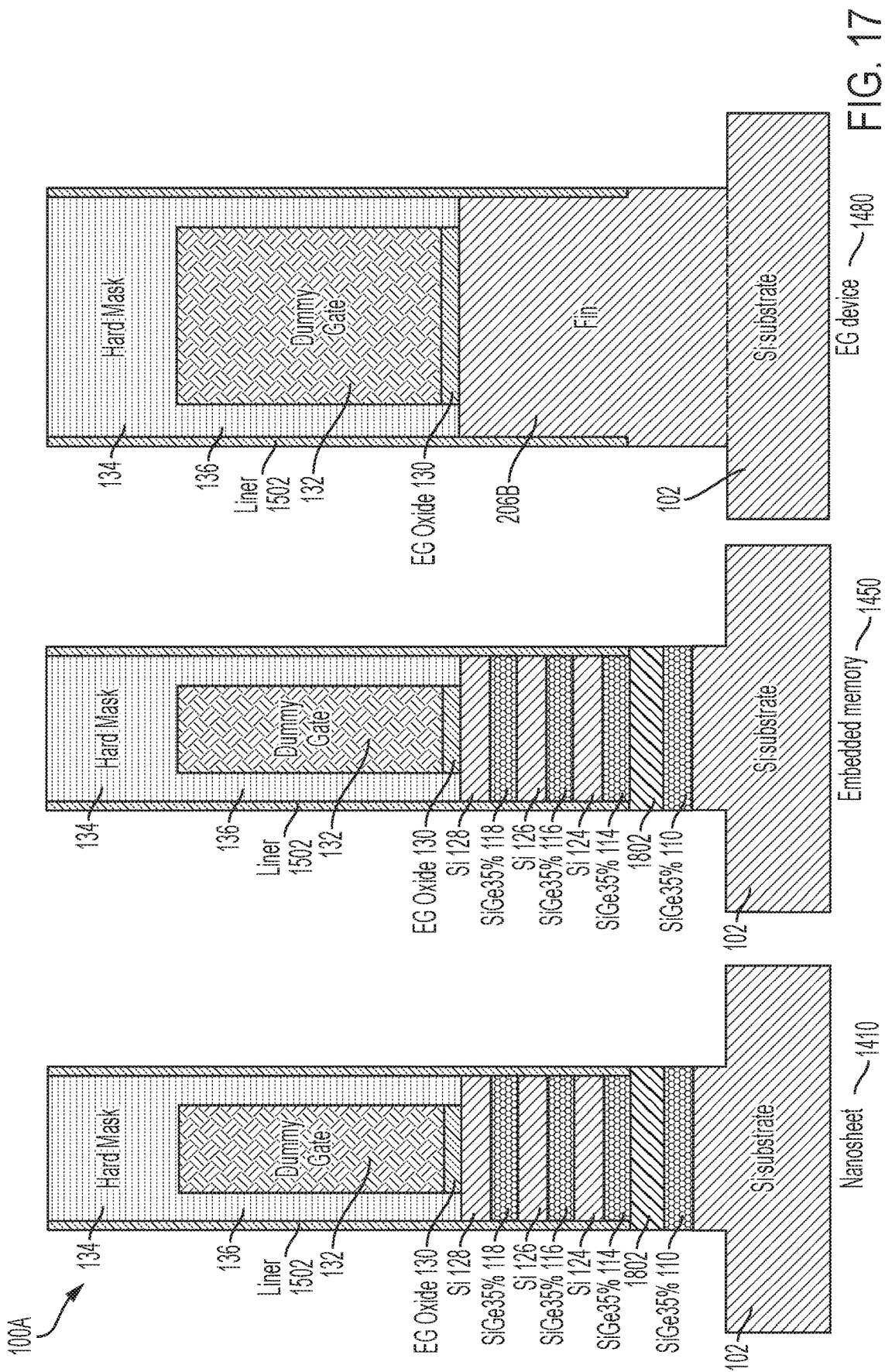

In FIG. 17, known semiconductor fabrication processes have been used to remove the SiGe50% nanosheet layer 112 (shown in FIG. 16). In embodiments of the invention, the nanosheet layer 112 is formed from SiGe50%, %, which can be selectively etched with respect to the Si and SiGe35% using, for example, vapor phase HCl. A layer of a dielectric material (e.g., an oxide or a nitride) is conformally deposited such that it pinches off in the space that was occupied the SiGe50% nanosheet layer 112 to form the dielectric layer 1802. In the embodiment of the invention depicted in FIG. 18, the conformally deposited layer of dielectric material is a nitride (e.g., SiN). The conformally deposited dielectric layer is removed from everywhere except the dielectric layer 1802 using, for example, a suitable a wet recess process.

Figure 18:
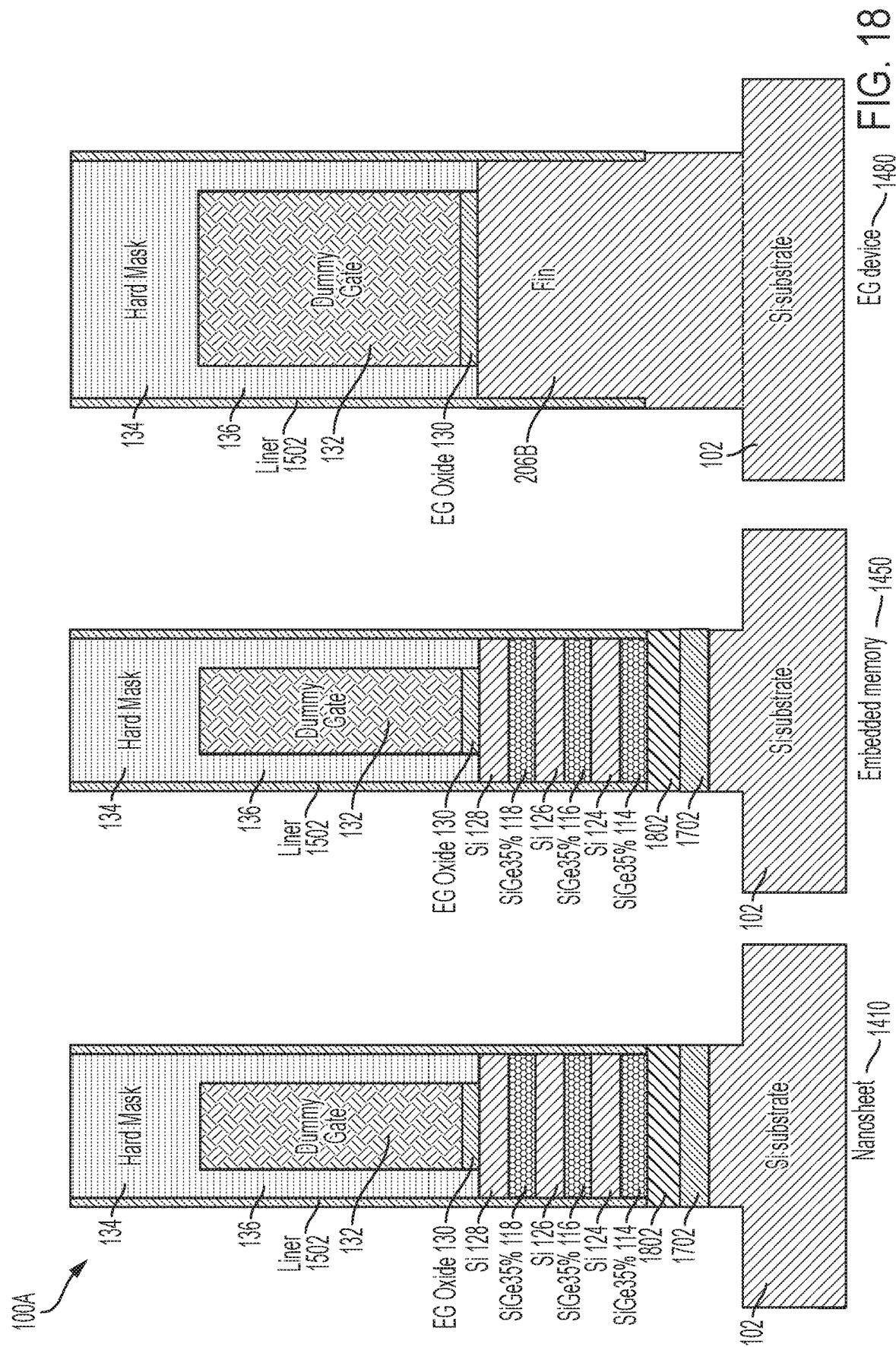

In FIG. 18, known semiconductor fabrication processes have been used to remove the SiGe35% nanosheet layer 110 (shown in FIG. 17). In embodiments of the invention, the SiGe35% nanosheet regions layer 110 can be removed by applying a selective etch (e.g., a hydrochloric acid (HCl)). A layer of a dielectric material (e.g., an oxide or a nitride) is conformally deposited such that it pinches off in the space that was occupied the SiGe35% nanosheet layer 110 to form the dielectric layer 1702. In the embodiment of the invention depicted in FIG. 17, the conformally deposited layer of dielectric material is an oxide (e.g., $SiO_2$). The conformally deposited dielectric layer is removed from everywhere except the dielectric layer 1702 using, for example, a suitable a wet recess process.

Figure 19:
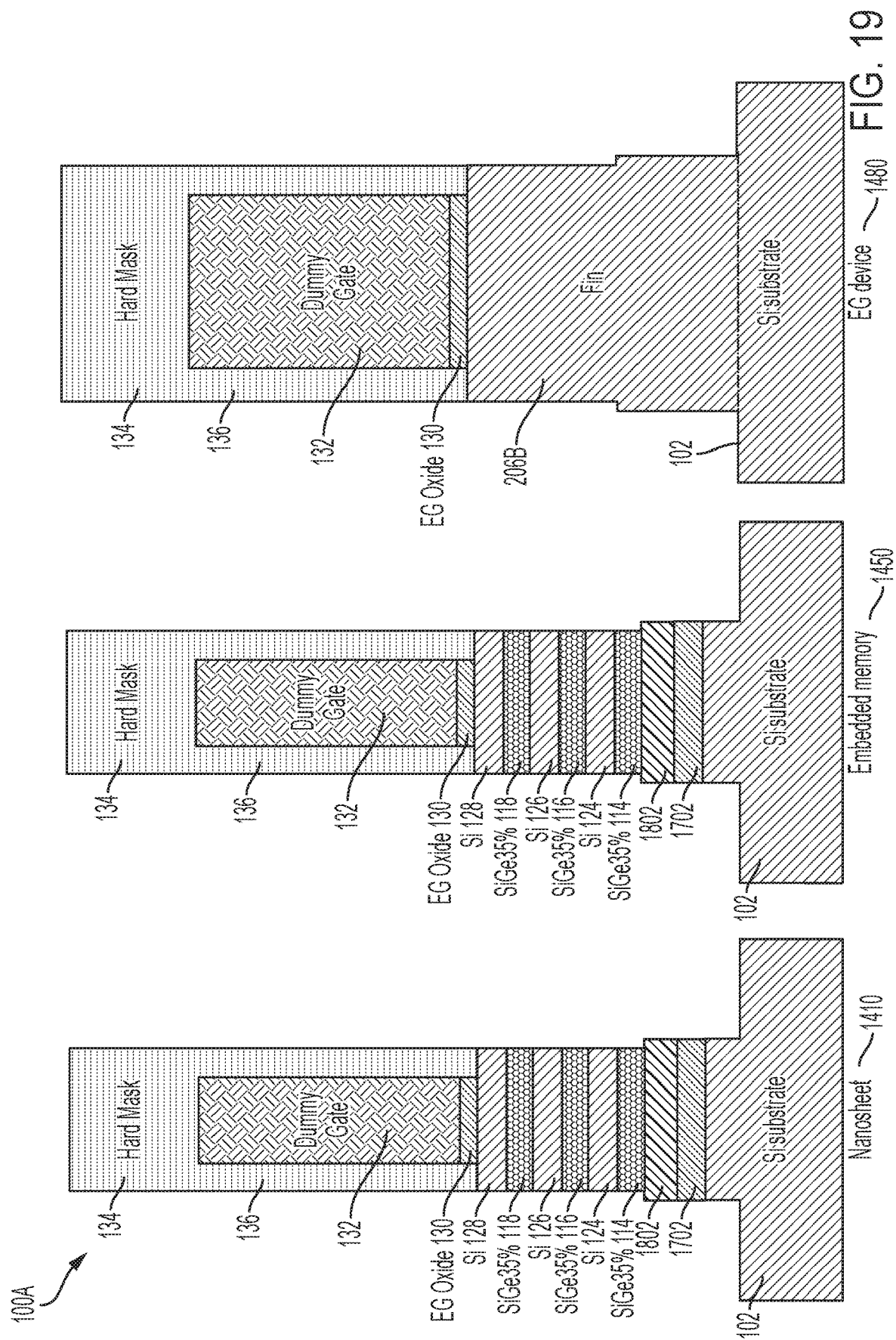

In FIG. 19, known semiconductor fabrication operations have been used to remove/strip the relatively thin protection liner 1502 (shown in FIG. 18).

Figure 20:
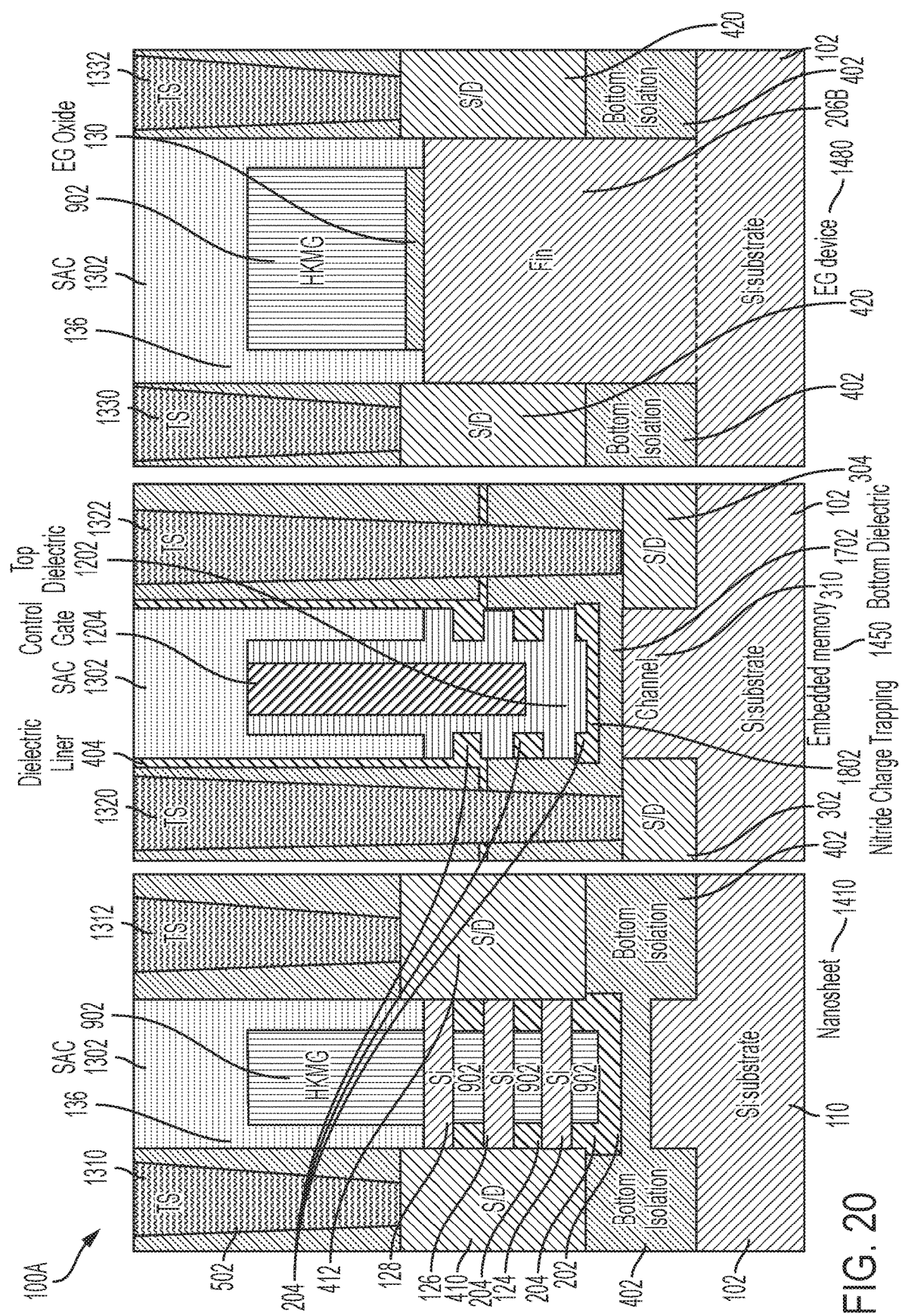

In FIG. 20, substantially the same fabrication operations depicted in FIGS. 2-13 have been applied to the IC wafer 100A shown in FIG. 19 to arrive at the IC wafer 100A shown in FIG. 20. The IC wafer 100A in FIG. 20 differs from the IC wafer 100 shown in FIG. 20 in that the on-chip embedded memory of the embedded memory region 1450 operates as a SONOS (silicon-oxide-nitride-oxide-silicon) floating gate flash memory, wherein charges are trapped in the nitride charge trapping layer 1802 instead of the bi-layer charge trapping region 1304 (shown in FIG. 13). All other operations of the on-chip embedded memory of the embedded memory region 1450 are substantially the same as the on-chip embedded memory of the embedded memory region 150 (shown in FIG. 13).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/ connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating devices on a substrate, the method comprising:
   performing memory fabrication operations to form a non-volatile memory device in a first region of the substrate, wherein the memory fabrication operations include:
      forming a first region of a nanosheet stack over the first region of the substrate, wherein the first region of the nanosheet stack comprises nanosheet layers of a first type of semiconductor material alternating with nanosheet layers of a second type of semiconductor material;
      replacing a first portion of the first region of the nanosheet stack with a control gate of the non-volatile memory device; and
      providing a charge trapping region of the non-volatile memory device under the control gate.

2. The method of claim 1, wherein the memory fabrication operations further include replacing a second portion of the first region of the nanosheet stack with memory source or drain (S/D) regions.

3. The method of claim 2, wherein:
   a portion of the first region of the substrate is between a first one of the S/D regions and a second one of the S/D regions; and
   a channel region comprises the portion of the first region of the substrate that is between the first one of the S/D regions and the second one of the S/D regions.

4. The method of claim 3, wherein the non-volatile memory device comprises:
   a non-volatile memory transistor formed over the first region of the substrate;
   the control gate; and
   the charge trapping region.

5. The method of claim 4, wherein the non-volatile memory transistor comprises:
   the first one of the S/D regions;
   the second one of the S/D regions; and
   the channel region.

6. The method of claim 1, wherein the charge trapping region comprises at least one of the nanosheet layers of the first type of semiconductor material.

7. The method of claim 6, wherein the charge trapping region further comprises at least one of the nanosheet layers of the second type of semiconductor material.

8. The method of claim 7, wherein:
   the first type of semiconductor material comprises silicon; and
   the second type of semiconductor material comprises silicon germanium.

9. The method of claim 1, wherein:
   the memory fabrication operations further include forming a dielectric stack under the control gate; and
   the dielectric stack comprises the charge trapping region.

10. The method of claim 9, wherein the dielectric stack further comprises:
    a first dielectric region;
    a second dielectric region; and
    the charge trapping region between the first dielectric region and the second dielectric region.

11. The method of claim 10, wherein the memory fabrication operations further include:
    prior to forming the first region of the nanosheet stack over the first region of the substrate, forming a first region of a first sacrificial nanosheet over the first region of the substrate such that the first region of the first sacrificial nanosheet is between the first region of the substrate and the first region of the nanosheet stack; and
    replacing the first region of the first sacrificial nanosheet with the second dielectric region of the dielectric stack.

12. The method of claim 1 further comprising:
    performing nanosheet fabrication operations to form a nanosheet field effect transistor (FET) device in a second region of the substrate, wherein the nanosheet fabrication operations include:
       forming a second region of the nanosheet stack over a second region of the substrate, wherein the second region of the nanosheet stack comprises nanosheet layers of the first type of semiconductor material alternating with nanosheet layers of the second type of semiconductor material;
       forming bottom isolation regions over the second region of the substrate;
       forming nanosheet source or drain (S/D) regions over the bottom isolation regions and adjacent end regions of the nanosheet layers of the first type of semiconductor material alternating with nanosheet layers of the second type of semiconductor material in the second region of the nanosheet stack;
       replacing the nanosheet layers of the second type of semiconductor material in the second region of the nanosheet stack with a first set of conductive gate regions; and forming a second conductive gate region over and around the second region of the nanosheet stack.

13. The method of claim 12 further comprising:
performing extended-gate (EG) fabrication operations to form a EG FET device in a third region of the substrate, wherein the EG fabrication operations include:
forming a fin in the third region of the substrate;
forming selected ones of the bottom isolation regions over the third region of the substrate and adjacent to a portion of the fin;
forming EG S/D regions over the selected ones of the bottom isolation regions and adjacent sidewalls of the fin; and
forming selected portions of the second conductive gate region over and around the fin.

14. A method of fabricating devices on a substrate, the method comprising:
performing memory fabrication operations to form a non-volatile memory device in a first region of the substrate, wherein the memory fabrication operations include:
forming a first region of the nanosheet stack over a first region of the substrate, wherein the first region of nanosheet stack comprises alternating layers of sacrificial nanosheets and non-sacrificial nanosheets;
replacing at least a portion of the first region of the nanosheet stack with a control gate; and
providing a charge trapping region of the non-volatile memory device under the control gate;
performing nanosheet fabrication operations to form a nanosheet field effect transistor (FET) device in a second region of the substrate, wherein the nanosheet fabrication operations include:
forming a second region of the nanosheet stack over a second region of the substrate, wherein the second region of the nanosheet stack comprises the alternating layers of sacrificial nanosheets and non-sacrificial nanosheets;
forming bottom isolation regions over the second region;
forming nanosheet source or drain (S/D) regions over the bottom isolation regions and adjacent end regions of the non-sacrificial nanosheets of the second region of the nanosheet stack;
replacing the sacrificial nanosheets of the second region of the nanosheet stack with a first set of conductive gate regions; and
forming a second conductive gate region over and around the second region of the nanosheet stack; and
performing extended-gate (EG) fabrication operations to form an EG FET device in a third region of the substrate, wherein the EG fabrication operations include:
forming a fin in the third region of the substrate;
forming selected ones of the bottom isolation regions over the third region of the substrate and adjacent to a portion of the fin;
forming EG S/D regions over the bottom isolation regions and adjacent sidewalls of the fin; and
forming selected portions of the second conductive gate region over and around the fin.

15. The method of claim 14, wherein:
the memory fabrication operations further include forming memory source or drain (S/D) regions over the first region of the substrate;
a portion of the first region of the substrate is between a first one of the S/D regions and a second one of the S/D regions;
a channel region comprises the portion of the first region of the substrate that is between the first one of the S/D regions and the second one of the S/D regions;
the non-volatile memory device comprises a non-volatile memory transistor, the control gate, and the charge trapping region;
the non-volatile memory transistor comprises:
the first one of the S/D regions;
the second one of the S/D regions; and
the channel region; and
the charge trapping region comprises at least one of the nanosheet layers of the second region of the nanosheet stack.

16. The method of claim 14, wherein:
the memory fabrication operations further include forming a dielectric stack under the control gate; and
the dielectric stack comprises the charge trapping region.

17. An integrated circuit structure comprising:
a first region of a nanosheet stack formed over a first region of a substrate, wherein the first region of the nanosheet stack comprises a nanosheet layer of a first type of semiconductor material and a nanosheet layer of a second type of semiconductor material;
a control gate formed over the first region of the nanosheet stack of the non-volatile memory device; and
a charge trapping region of the non-volatile memory device under the control gate, wherein the charge trapping region comprises the nanosheet layer of the first type of semiconductor material and the nanosheet layer of the second type of semiconductor material;
memory source or drain (S/D) regions over the first region of the substrate;
a portion of the first region of the substrate positioned between a first one of the S/D regions and a second one of the S/D regions; and
a channel region comprising the portion of the first region of the substrate that is positioned between the first one of the S/D regions and the second one of the S/D regions;
wherein a non-volatile memory device of the integrated circuit comprises a non-volatile memory transistor, the control gate, and the charge trapping region; and
wherein the non-volatile memory transistor comprises:
the first one of the S/D regions;
the second one of the S/D regions; and
the channel region.

18. The structure of claim 17, wherein:
the first type of semiconductor material comprises silicon; and
the second type of semiconductor material comprises silicon germanium.

19. The structure of claim 17 further comprising:
a nanosheet field effect transistor (FET) device formed in a second region of the substrate, wherein the nanosheet FET device includes:
a second region of the nanosheet stack formed over a second region of the substrate, wherein the second region of the nanosheet stack comprises nanosheet layers of the first type of semiconductor material;
bottom isolation regions formed over the second region of the substrate;
nanosheet S/D regions over the bottom isolation regions and adjacent end regions of the nanosheet layers of the first type of semiconductor material in the second region of the nanosheet stack;

a first set of conductive gate regions formed in spaces between the nanosheet layers of the first type of semiconductor material in the second region of the nanosheet stack; and a second conductive gate region over and around the second region of the nanosheet stack.

20. The structure of claim 19 further comprising:

an extended-gate (EG) FET device in a third region of the substrate, wherein the EG FET device includes:

a fin formed in the third region of the substrate;

selected ones of the bottom isolation regions formed over the third region of the substrate and adjacent to a portion of the fin;

EG S/D regions over the selected ones of the bottom isolation regions and adjacent sidewalls of the fin; and selected portions of the second conductive gate region formed over and around the fin.

* * * * *